United States Patent
Kim et al.

(10) Patent No.: US 10,622,499 B2
(45) Date of Patent: Apr. 14, 2020

(54) SOLAR CELL MODULE

(71) Applicant: LG ELECTRONICS INC., Seoul (KR)

(72) Inventors: Bojoong Kim, Seoul (KR); Minpyo Kim, Seoul (KR); Hyunjung Park, Seoul (KR); Goohwan Shim, Seoul (KR); Hyeyoung Yang, Seoul (KR); Joonhan Kwon, Seoul (KR); Daeseon Hyun, Seoul (KR); Byungjun Kang, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 238 days.

(21) Appl. No.: 15/584,775

(22) Filed: May 2, 2017

(65) Prior Publication Data
US 2017/0323988 A1    Nov. 9, 2017

(30) Foreign Application Priority Data

May 3, 2016   (KR) .................. 10-2016-0054593
May 10, 2016  (KR) .................. 10-2016-0056860
Jun. 3, 2016  (KR) .................. 10-2016-0069195

(51) Int. Cl.
*H02S 40/36*   (2014.01)
*H01L 31/042*  (2014.01)
(Continued)

(52) U.S. Cl.
CPC .......... *H01L 31/042* (2013.01); *H01L 27/142* (2013.01); *H01L 31/02008* (2013.01);
(Continued)

(58) Field of Classification Search
CPC ................. H01L 31/042; H01L 31/048; H01L 31/022425; H01L 31/02008; H01L 31/058; H02S 40/22; H02S 40/36
See application file for complete search history.

(56) References Cited

U.S. PATENT DOCUMENTS

2005/0268959 A1    12/2005  Aschenbrenner et al.
2009/0090412 A1*   4/2009   Calwer ............... H01L 31/0749
                                                        136/259
2014/0116495 A1*   5/2014   Kim ........................ H02S 40/22
                                                        136/246

FOREIGN PATENT DOCUMENTS

DE   112013002371 T5   1/2015
EP       2897179 A2    7/2015
(Continued)

*Primary Examiner* — Matthew T Martin
(74) *Attorney, Agent, or Firm* — Birch, Stewart, Kolasch & Birch, LLP

(57) ABSTRACT

A solar cell module includes a plurality of cell strings having a plurality of solar cells, each solar cell having a semiconductor substrate, and a first conductivity-type electrode and a second conductivity-type electrode provided on a first surface of the semiconductor substrate, an interconnector electrically connecting a first conductivity-type electrode of a first solar cell, among the plurality of solar cells included in the plurality of cell strings, and a second conductivity-type electrode of a second solar cell adjacent to the first solar cell in a first direction, to connect the first and second solar cells in series, and a first shield positioned on a front surface of the interconnector between the first and second solar cells, and extending in a second direction crossing the first direction.

15 Claims, 29 Drawing Sheets

(51) Int. Cl.
*H01L 31/02* (2006.01)
*H01L 31/0224* (2006.01)
*H01L 31/048* (2014.01)
*H01L 31/05* (2014.01)
*H02S 40/22* (2014.01)
*H01L 27/142* (2014.01)

(52) U.S. Cl.
CPC .... *H01L 31/022425* (2013.01); *H01L 31/048* (2013.01); *H01L 31/0508* (2013.01); *H02S 40/22* (2014.12); *H02S 40/36* (2014.12); *Y02E 10/50* (2013.01); *Y02E 10/52* (2013.01)

(56) References Cited

FOREIGN PATENT DOCUMENTS

| | | |
|---|---|---|
| JP | 2013-98496 A | 5/2013 |
| JP | 2015-65304 A | 4/2015 |
| KR | 10-2015-0086119 A | 7/2015 |
| KR | 10-2016-0034100 A | 3/2016 |

* cited by examiner (a)

(b)

(c)

(a)

(b)

(a)

(b)

SOLAR CELL MODULE

CROSS-REFERENCE TO RELATED APPLICATION

This application claims priority to and the benefit of Korean Patent Application No. 10-2016-0054593 filed in the Korean Intellectual Property Office on May 3, 2016, Application No. 10-2016-0056860 filed in the Korean Intellectual Property Office on May 10, 2016, and Application No. 10-2016-0069195 filed in the Korean Intellectual Property Office on Jun. 3, 2016, all of which are incorporated by reference into the present application.

BACKGROUND OF THE INVENTION

Field of the Invention

Embodiments of the invention relate to a solar cell module.

Description of Related Art

Recently, as existing energy resource such as oil or coal has been exhausted, interest in alternative energy to replace such existing energy resource has been rising and solar cells producing electric energy from solar energy have come to prominence.

A general solar cell has different types of semiconductor parts (e.g., p-type and n-type semiconductor parts) forming a p-n junction and electrodes respectively connected to the different types of semiconductor parts.

When light is incident to such a solar cell, a plurality of electron-hole pairs are generated in the semiconductor parts, the generated electron-hole pairs are separated into electrons and holes, and the electrons migrates toward the n-type semiconductor part and the holes migrates toward the p-type semiconductor part. The migrating electrons and holes are collected by the different electrodes respectively connected to the n-type semiconductor part and the p-type semiconductor part, and when the electrodes are connected by an electric wire, power is obtained.

A plurality of solar cells may be connected by interconnectors to form a module.

The related art solar cell module has shortcomings in that a plurality of interconnectors are visible from the outside of the module, making the solar cell module seen untidy and unattractive.

In addition, cell strings in which the plurality of solar cells are connected by interconnectors are connected by bushing bars, and here, since the bushing bars are visible from the outside of the module, make the solar cell module seen untidy and unattractive.

SUMMARY OF THE INVENTION

In one aspect, there is provided a solar cell module including a plurality of cell strings having a plurality of solar cells, each solar cell having a semiconductor substrate, and a first conductivity-type electrode and a second conductivity-type electrode provided on a first surface of the semiconductor substrate; an interconnector electrically connecting a first conductivity-type electrode of a first solar cell, among the plurality of solar cells included in the plurality of cell strings, and a second conductivity-type electrode of a second solar cell adjacent to the first solar cell in a first direction, to connect the first and second solar cells in series; and a first shield positioned on a front surface of the interconnector between the first and second solar cells, and extending in a second direction crossing the first direction, wherein a width of a first portion of the first shield positioned between chamfered areas of the semiconductor substrates of the first and second solar cells is larger than a width of a central portion positioned on an inner side of the first portion.

A light reflective layer including one of a plurality of concavo-convex portions, light reflective particles, and a metal may be provided on a front surface of the first shield as a light receiving surface of the first shield.

The first shield may be spaced apart from the semiconductor substrate of each of the first and second solar cells, rather than overlapping the semiconductor substrate of each of the first and second solar cells.

The width of the first portion of the first shield may be increased toward both ends of the first shield.

A sum of minimum spacing between the first shield and each of the semiconductor substrates respectively provided in the first and second solar cells may be 0.6 mm to 1.4 mm.

The first shield may include a substrate formed of an insulating material and a cohesion layer positioned on a rear surface of the substrate facing the interconnector and cohering to the interconnector.

The substrate may include polyethylene terephthalate (PET), and the cohesion layer may include at least one of an epoxy group, an acrylic group, and a silicone group.

The first shield may have thermal strain of 10% or less at 180° C. or lower.

A color of the light receiving surface of the first shield may be the same color or the same group color as a color of a rear sheet positioned on a rear surface of the first and second solar cells.

Both ends of the first shield in the first direction may be bent toward the interconnector.

The solar cell module may further include a first conductive line connected to the first conductivity-type electrode provided in each of the plurality of solar cells and a second conductive line connected to the second conductivity-type electrode provided in each of the plurality of solar cells. The first conductive line connected to the first solar cell and the second conductive line connected to the second solar cell may be commonly connected to the interconnector.

The first shield may be positioned to overlap the first and second conductive lines exposed between the first and second solar cells.

The first shield may cohere to overlap a front edge area of at least one of the semiconductor substrates provided in the first and second solar cells.

The first shield may overlap the front edge area of the semiconductor substrate of the first solar cell and the front edge area of the semiconductor substrate of the second solar cell.

The interconnector may completely overlap the first shield.

The solar cell module may further include a bushing bar connected to the final solar cell of each of adjacent first and second cell strings among the plurality of cell strings and connecting the first and second cell strings in the second direction; and a second shield positioned to extend in the second direction on a front surface of the bushing bar, to visually block the bushing bar.

A line width of both ends of the second shield in the second direction may be larger than a central line width of the second shield, and the second shield may be asymmetrical with respect to a central line in the second direction.

An inner part of the second shield adjacent to a final solar cell of each of the first and second cell strings may protrude toward the final solar cell from a corner portion of the final solar cell. An outer part of the second shield positioned on an opposite side of the inner part may be linearly formed.

A portion protruding from the inner part of the second shield may protrude in the first direction.

The inner part of the second shield may be spaced apart from the semiconductor substrate of the final solar cell or may overlap a front edge area of the semiconductor substrate of the final solar cell.

The second shield may further include an extending portion positioned between the first and second cell strings.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION OF THE EMBODIMENTS

Figure 1:
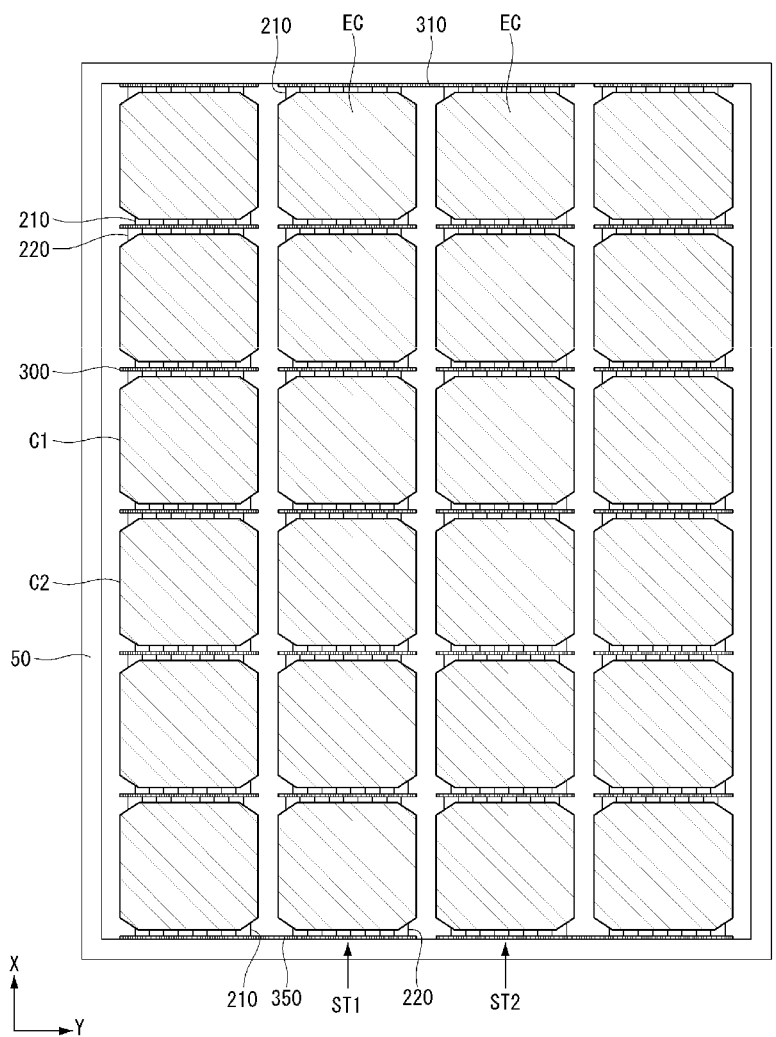
FIG. 1 is an overall plan view of a solar cell module without first and second shields according to an embodiment of the present disclosure.

Hereinafter, an example embodiment of the invention will be described in detail with reference to the attached drawings. A detailed description of the invention to be described hereinafter together with the attached drawings describes an example embodiment of the invention and does not represent a sole embodiment in which the present invention may be executed. The following detailed description includes detailed contents in order to provide complete understanding of the present invention. However, a person of ordinary skill in the art knows that the present invention may be executed without such detailed contents.

Reference will now be made in detail to embodiments of the invention, examples of which are illustrated in the accompanying drawings. This invention may, however, be embodied in many different forms and should not be construed as limited to the embodiments set forth herein. Wherever possible, the same reference numbers will be used throughout the drawings to refer to the same or like parts. It will be noted that a detailed description of known arts will be omitted if it is determined that the detailed description of the known arts can obscure the embodiments of the invention.

In the drawings, the thickness of layers, films, panels, regions, etc., are exaggerated for clarity. It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, it will be understood that when an element such as a layer, film, region, or substrate is referred to as being "entirely" on other element, it may be on the entire surface of the other element and may not be on a portion of an edge of the other element.

Hereinafter, a front surface may be one surface of a semiconductor substrate to which direct light is incident, and a rear surface may be a surface opposing the one surface of the semiconductor substrate to which direct light is not incident or reflective light, rather than direct light, may be incident.

Also, hereinafter, a cell string refers to a structure or a form in which a plurality of solar cells are connected in series.

Figure 2:
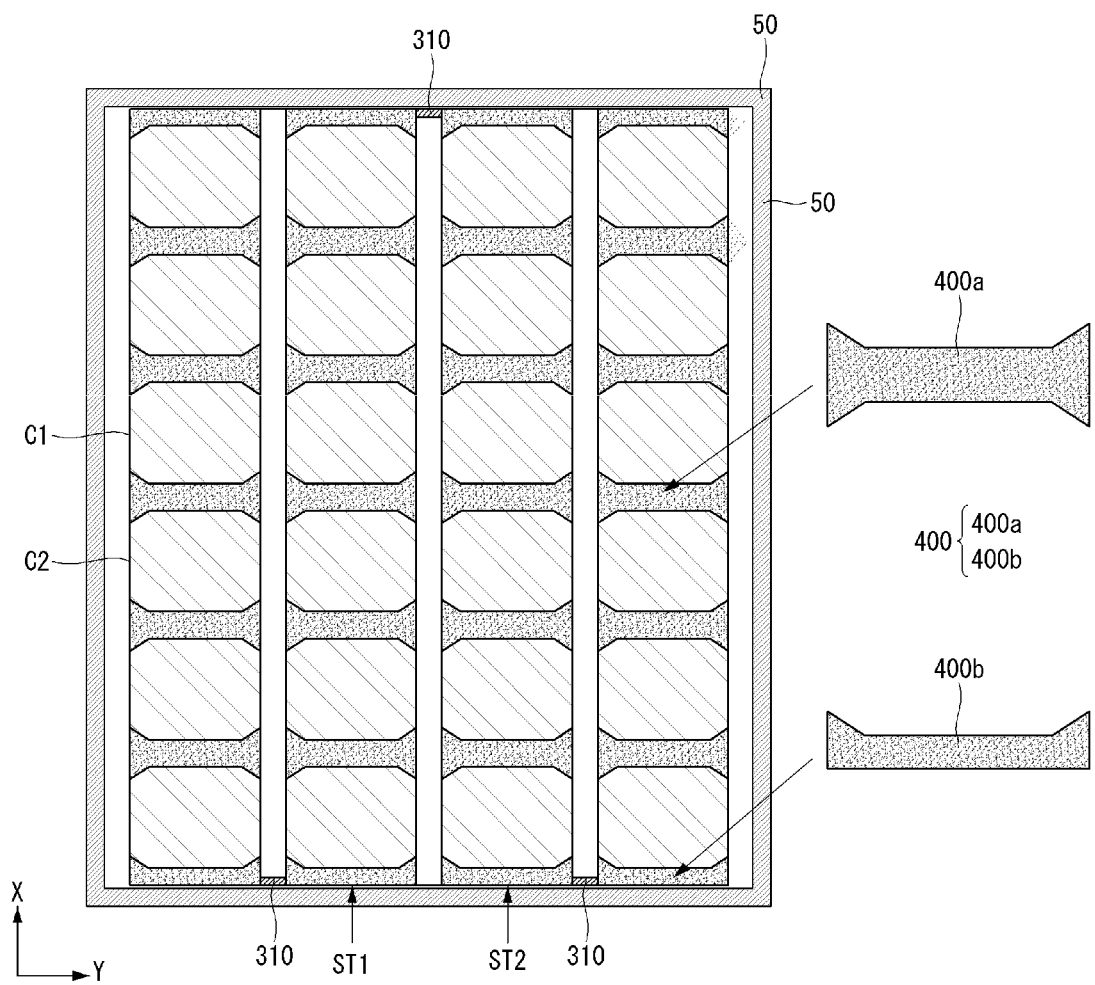
FIG. 2 is an overall planar view of a solar cell module including first and second shields in FIG. 1.
Figure 3:
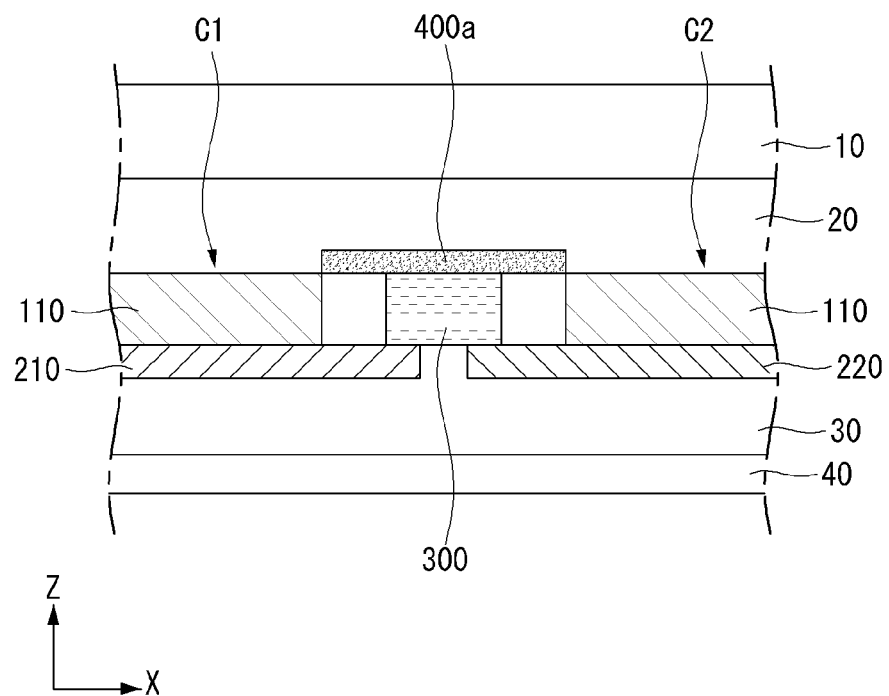
FIG. 3 is a cross-sectional view of a solar cell module according to an embodiment of the invention.

FIG. 1 is an overall plan view of a solar cell module without first and second shields according to an embodiment of the present disclosure, FIG. 2 is an overall planar view of a solar cell module including first and second shields in FIG. 1, and FIG. 3 is a cross-sectional view of a solar cell module according to an embodiment of the invention.

As illustrated in FIGS. 1 to 3, a solar cell module according to the present invention includes a plurality of cell strings to which a plurality of solar cells are connected, interconnectors 300 connecting the plurality of solar cells in series, bushing bars 310 connecting the plurality of cell strings, a first shield 400a, and a second shield 400b.

In addition, the solar cell module according to the present invention may further include first and second conductive lines 210 and 220 connected to each of a plurality of solar cells, a front transparent substrate 10 encapsulating the cell strings, fillers 20 and 30, a rear sheet 40, and a frame 50.

Here, in each of the cell strings, a plurality of solar cells arranged to extend in a first direction (x) may be connected by the interconnectors 300 in the first direction (x).

Here, each of the plurality of solar cells may have a semiconductor substrate 110 and a first conductive electrode 141 and a second conductive electrode 142 provided on a surface, e.g., a rear surface, of the semiconductor substrate 110.

The plurality of solar cells will be described in more detail with reference to FIG. 5 and the following drawings hereinafter.

As illustrated in FIGS. 1 and 3, the plurality of first and second conductive lines 210 and 220 may be connected to a rear surface of each of the plurality of solar cells.

Here, the plurality of first conductive lines 210 may respectively be connected to a plurality of first conductive electrodes 141 formed in each of the solar cells, and the plurality of second conductive lines 220 may respectively be connected to a plurality of second conductive electrodes 142 formed in each of the solar cells.

The plurality of first and second conductive lines 210 and 220 connected to each of the solar cells may be commonly connected to the inter connectors 300.

For example, as illustrated in FIGS. 1 and 3, the plurality of first conductive lines 210 connected to a first solar cell C1 and the plurality of second conductive lines 220 connected to the second solar cell C2 may be commonly connected to the interconnector 300 positioned between the first and second solar cells C1 and C2.

In this manner, the plurality of solar cells, to which the plurality of first and second conductive lines 210 and 220 are connected, may be connected in series in the first direction (x) by the interconnector 300 as illustrated in FIGS. 1 and 3.

Here, as illustrated in FIG. 1, the interconnector 300 connecting the first and second solar cells C1 and C2 in series may be disposed to extend in the second direction (y) between adjacent first and second solar cells C1 and C2 among the plurality of solar cells included in each of the plurality of cell strings.

Here, as illustrated in FIGS. 1 and 3, a front surface of each of the plurality of first conductive lines 210 connected to the first solar cell C1 and a front surface of each of the plurality of second conductive lines 220 connected to the second solar cell C2 may be connected to a rear surface of the interconnector 300. Thus, a cell string in which the plurality of solar cells are connected in series may be formed.

In addition, the plurality of cell strings formed to extend in the first direction (x) may be spaced apart from each other in the second direction (y).

The bushing bar 310 may connect adjacent first and second cell strings ST1 and ST2, among the plurality of cell strings spaced apart from each other in the second direction (y), in the second direction (y).

In detail, as illustrated in FIG. 1, for example, an end portion of each of a plurality of first conductive lines 210 connected to a final solar cell EC of the first string ST1 and an end of each of a plurality of second conductive lines 220 connected to the final solar cell EC of the second cell string ST2 may protrude from a projection area of the semiconductor substrate 110.

In this manner, front surfaces of end portions of the plurality of first and second conductive lines 210 and 220 connected to the final solar cells EC of the first and second cell strings ST1 and ST2 may be commonly connected to a rear surface of the bushing bar 310.

Thus, the bushing bar 310 may be connected to the first conductive line 210 connected to the final solar cell EC of the first cell string ST1 and the second conductive line 220 connected to the final solar cell EC of the second cell string ST2 which are adjacent to each other, among the plurality of cell strings, to connect the first and second cell strings ST1 and ST2 in the second direction (y).

As illustrated in FIG. 3, the cell string may be disposed between the front transparent substrate 10 and the rear sheet 40 and thermally compressed to be laminated.

For example, the plurality of solar cells may be disposed between the front transparent substrate 10 and the rear sheet 40 and the transparent fillers 20 and 30 such as an EVA sheet may be disposed between a front surface and a rear surface of the entirety of the plurality of solar cells, and in this state, the front transparent substrate 10, the rear sheet 40, and the fillers 20 and 30 may be integrated to be encapsulated through a lamination process of simultaneously applying heat and pressure.

In addition, as illustrated in FIG. 1, the front transparent substrate 10, the rear sheet 40, and the fillers 20 and 30 encapsulated through the lamination may be fixed in edges by the frame 50 so as to be protected.

Thus, as illustrated in FIG. 1, the plurality of solar cells, the plurality of first and second conductive lines 210 and 220, the interconnectors 300, the rear sheet 40, and the frame 50 may be seen through the front transparent substrate 10 and the fillers 20 and 30 on the front surface of the solar cell module.

The cell strings may be positioned to extend in the first direction (x) and arranged to be spaced apart from each other in the second direction (y). The plurality of cell strings may be connected in series in the second direction (y) by the bushing bar 310 extending in the second direction (y).

Here, the front transparent substrate 10 may be formed of tempered glass having high transmittance and an excellent anti-damage function, or the like.

The rear sheet 40 may prevent moisture penetration from a rear surface of the solar cells C1 and C2, protecting the solar cells C1 and C2 from an external environment. The rear sheet 40 may have a multi-layer structure including a layer preventing penetration of moisture and oxygen and a layer preventing chemical corrosion.

The rear sheet 40 may be a thin sheet formed of an insulating material such as fluoropolymer (FP)/polyester (PE)/fluoropolymer (FP) or may be an insulating sheet formed of any other insulating material.

The lamination process may be performed in a state in which the sheet-shaped fillers 20 and 30 are respectively disposed between the front transparent substrate 10 and the solar cell and between the solar cell and the rear sheet 40.

Here, the fillers 20 and 30 may be formed of a material different from that of an insulating layer 252 and may be formed of a material such as ethylene vinyl acetate (EVA) capable of preventing corrosion due to penetration of moisture, protecting the solar cells C1 and C2 from an impact, and absorbing an impact.

Thus, the sheet-shaped fillers 20 and 30 disposed between the front transparent substrate 10 and the solar cell and between the solar cell and the rear substrate may be softened and hardened by heat and pressure during the lamination process.

The solar cell module may include a first shield 400a and a second shield 400b to visually block the interconnector 300 and the bushing bar 310 to make an appearance of the module appealing. Here, the first shield 400a may be positioned to extend in the second direction (y) on a front surface of the interconnector 300 to visually block the interconnector 300 to make the appearance of the solar cell module even more appealing.

In detail, as illustrated in FIG. 2, the first shield 400a may be positioned on the interconnector 300 positioned between the solar cells forming the cell string and may have a shape symmetrical with respect to a central line of the second direction (Y).

Here, a color of a light receiving surface of the first shield 400a may be the same as or similar to that of the rear sheet 40 seen between the cell strings to make the appearance of the solar cell module even more appealing.

The first shield 400a will be described in more detail with reference to FIG. 5A and the following drawings.

The second shield 400b may be positioned to extend in the second direction (y) on a front surface of the bushing bar 310 to visually block the bushing bar 310 to make the appearance of the solar cell module even more appealing.

As illustrated in FIG. 2, the second shield 400b may be positioned on the bushing bar 310 connected to the final solar cell EC of each cell string, and may have a shape symmetrical with respect to a central line in the second direction (y).

Here, as illustrated in FIG. 2, the second shield 400b may be positioned at an upper end and a lower end of the solar cell module in the first direction (x).

Both ends of an inner part of the second shield 400b adjacent to each solar cell positioned at an end of the cell string may protrude toward the solar cell EC, and an outer part of the second shield 400b may be linearly formed.

In the solar cell module according to an embodiment of the present invention, the presence of the second shield 400b makes the appearance of the solar cell module more appealing.

The second shield 400b will be described in more detail with reference to FIG. 23 and the following drawings.

FIGS. 4A to 7 are views illustrating an example of a solar cell module according to the present invention.

Figure 4A:
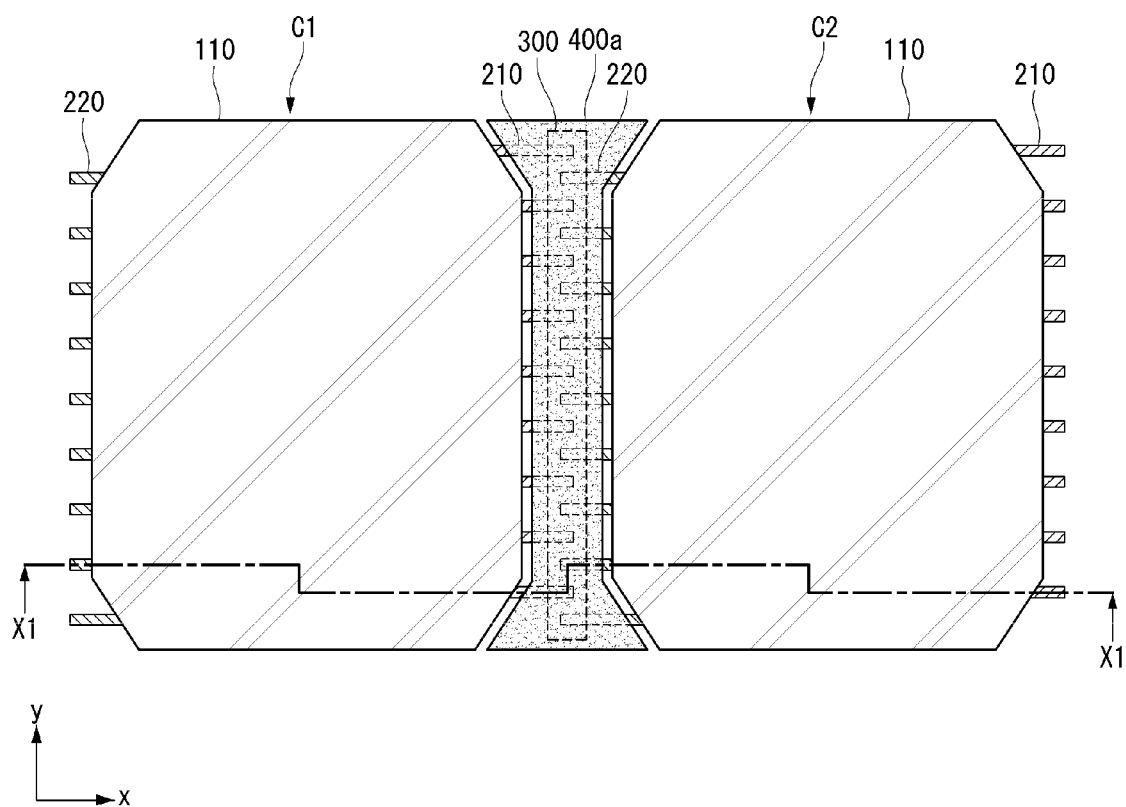
FIGS. 4A to 7 are views illustrating an example of a solar cell module according to an embodiment.
Figure 4B:
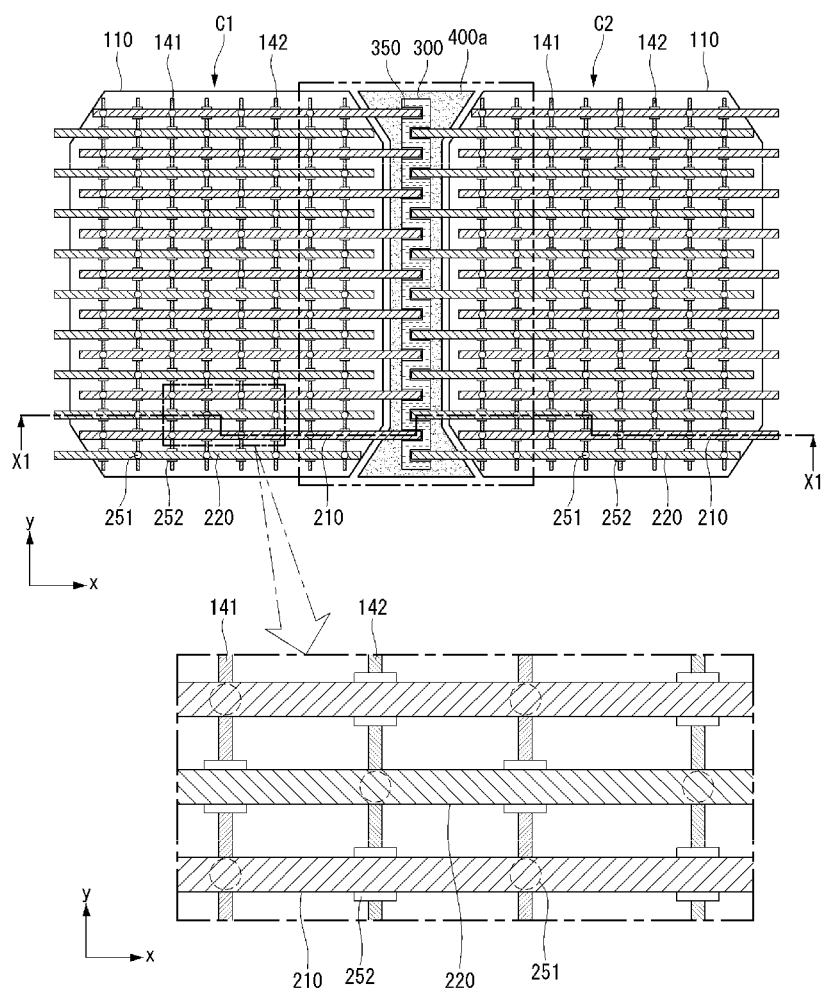

Here, FIG. 4A is illustrates a front surface of the solar cell module and FIG. 4B illustrates a rear surface of the solar cell module.

As illustrated in FIGS. 4A and 4B, the solar cell module according to the present invention may include a plurality of first and second solar cells C1 and C2, a plurality of first and second conductive lines 210 and 220, an interconnector 300, and a first shield 400a.

Here, the plurality of solar cells C1 and C2 may be arranged to be spaced apart from each other in the first direction (x), and may each have at least a semiconductor substrate 110 and a plurality of first conductive electrodes 141 and a plurality of second conductive electrodes 142 spaced apart from each other and extend in the second direction (y) crossing the first direction (x) on a rear surface of the semiconductor substrate 110.

Also, the plurality of first and second conductive lines 210 and 220 may extend in the first direction (x) in which the first and second solar cells C1 and C2 are arranged, and may be connected to each of the plurality of solar cells.

The plurality of first and second conductive lines 210 and 220 may include a plurality of first conductive lines 210 connected to the plurality of first conductive electrodes 141 provided in each of the first and second solar cells C1 and C2 in a crossing and overlapping manner and a plurality of second conductive lines 220 connected to the plurality of second conductive electrodes 142 in a crossing and overlapping manner.

In detail, the first conductive lines 210 may be connected to the first conductive electrodes provided in each of the plurality of solar cells C1 and C2 through a first conductive adhesive 251 formed of a conductive material, and may be insulated from the second conductive electrodes 142 by an insulating layer 252 formed of a material having insulating properties.

The second conductive lines 220 are connected to the second conductive electrodes 142 provided in each of the plurality of solar cells C1 and C2 through the first conductive adhesive 251, and may be insulated from the first conductive electrodes 141 by the insulating layer 252.

The first and second conductive lines 210 and 220 may include a conductive core formed of a conductive metal and including any one of gold (Au), silver (Ag), copper (Cu), and aluminum (Al) and a conductive coating layer coating a surface of the core and including tin (Sn) or an alloy including tin (Sn).

Among both ends of the first conductive line 210, an end portion connected to the interconnector 300 may protrude outwardly from the semiconductor substrate 110, and, among both ends of the second conductive line 220, an end portion connected to the interconnector 300 may protrude outwardly from the semiconductor substrate 110 in the first direction (x).

End portions of the plurality of first and second conductive lines 210 and 220 may be connected to the interconnector 300 to connect the plurality of solar cells in series.

In detail, the interconnector 300 may be positioned between the first solar cell C1 and the second solar cell C2 and may extend in the second direction (y). Here, the interconnector 300 may be disposed to be spaced apart from the semiconductor substrate 110 of the first solar cell C1 and the semiconductor substrate 110 of the second solar cell C2.

An end portion of the first conductive line 210 connected to the first conductive electrode 141 of the first solar cell C1 and an end portion of the second conductive line 220 connected to the second conductive electrode 142 of the second solar cell C2 are commonly connected to the interconnector 300 to connect the first and second solar cells C1 and C2 in series in the first direction (x).

The first shield 400a may be positioned on a front surface of the interconnector 300 between the first and second solar cells C1 and C2 and may be positioned to be spaced apart from the first and second solar cells C1 and C2.

The first shield 400a may be opaque or translucent to completely visually block the interconnector 300 and portions of the first and second conductive lines 210 and 220 positioned between the first and second solar cells C1 and C2 or leave only the contour of the interconnector 300 and the first and second conductive lines 210 and 220 to make the appearance of the module seen to be neat and appealing.

Each component of the solar cell module will be described in detail.

Figure 5:
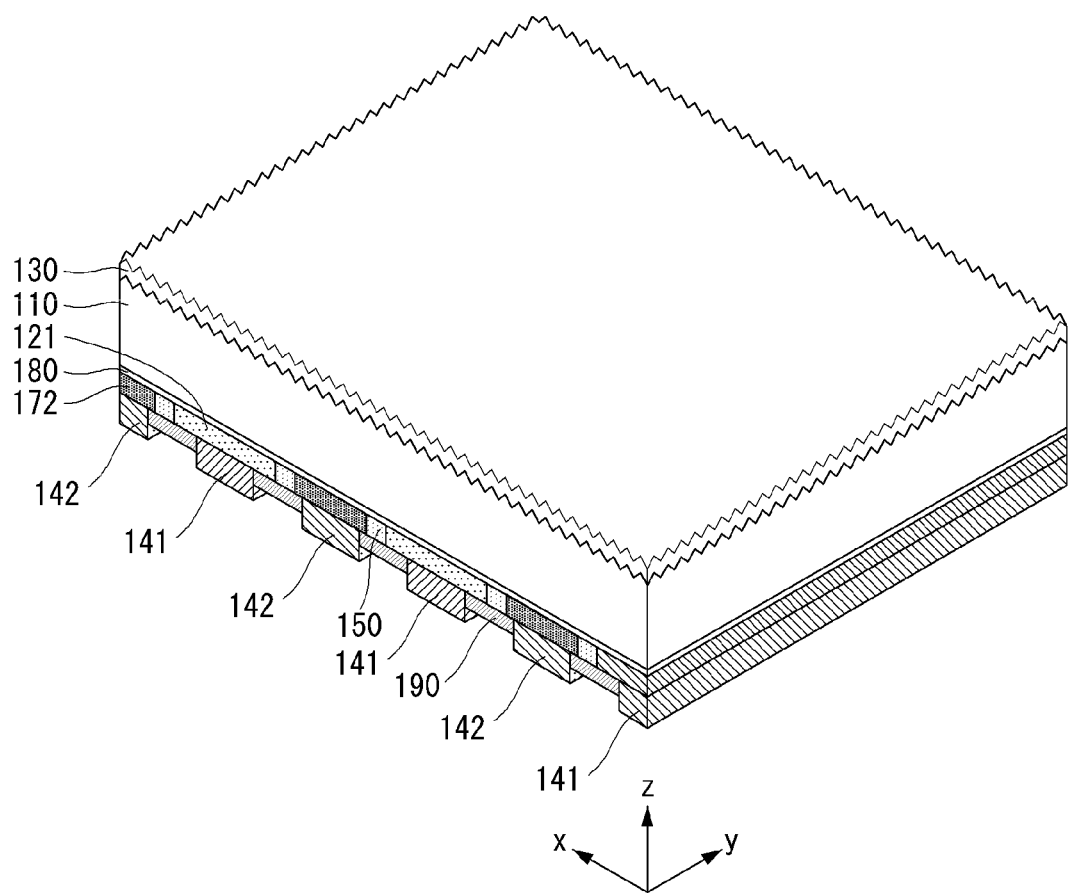
Figure 6:
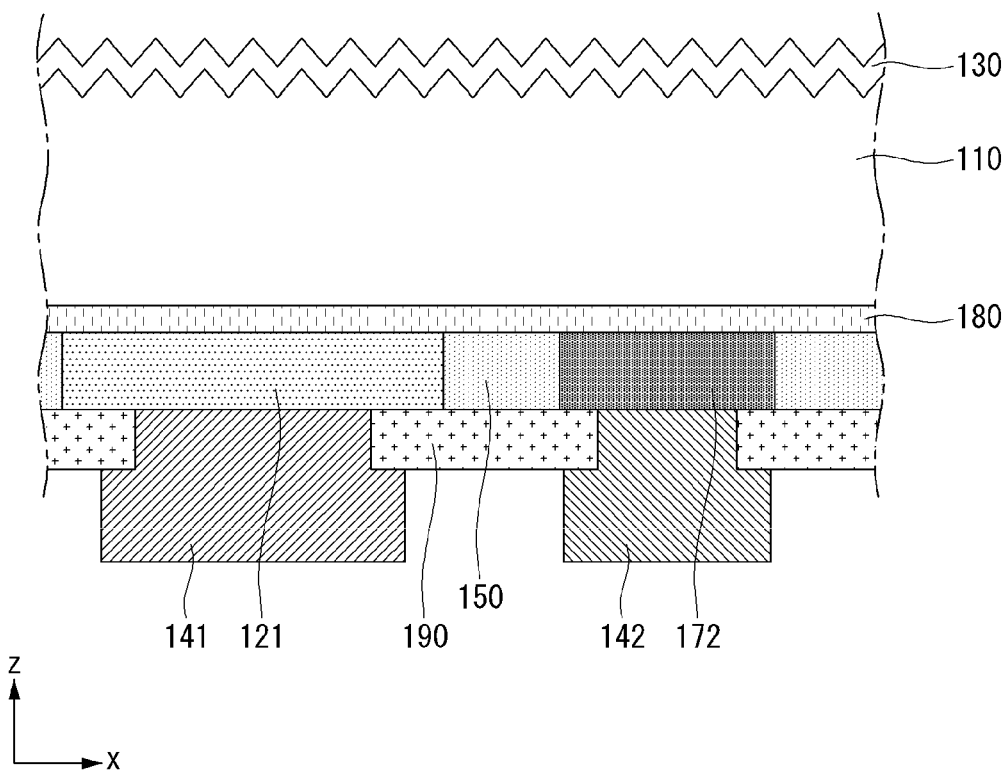

FIG. 5 is a partial perspective view illustrating an example of a solar cell applied to FIG. 1, and FIG. 6 is a cross-sectional view of the solar cell illustrated in FIG. 5 in the first direction (x).

As illustrated in FIGS. 5 and 6, an example of the solar cell according to the present invention may include an anti-reflective film 130, a semiconductor substrate 110, a tunnel layer 180, a first semiconductor part 121, a second semiconductor part 172, an intrinsic semiconductor part 150, a passivation layer 190, a plurality of first conductive electrodes 141, and a plurality of second conductivity electrodes 142.

Here, the anti-reflective film 130, the tunnel layer 180, and the passivation layer 190 may be omitted; however, the presence of the anti-reflective film 130, the tunnel layer 180, and the passivation layer 190 further enhances efficiency of the solar cell, and thus, an instance of including the anti-reflective film 130, the tunnel layer 180, and the passivation layer 190 will be described as an example hereinafter.

The semiconductor substrate 110 may be formed of at least anyone of single crystal silicon and polycrystalline silicon doped with a first conductivity-type or second conductivity-type impurity. For example, the semiconductor substrate 110 may be formed of a single crystal silicon wafer.

Here, the first conductivity-type impurity or the second conductivity-type impurity contained in the semiconductor substrate 110 may be any one of an n-type conductivity-type impurity or a p-type conductivity-type impurity.

When the semiconductor substrate 110 has a p type conductivity-type impurity, an impurity of a trivalent element such as boron (B), gallium (Ga), or indium (In) is doped in the semiconductor substrate 110. Also, when the semiconductor substrate 110 has an n type conductivity-type impurity, an impurity of a quinquevalent element such as phosphorus (P), arsenic (As), or antimony (Sb) may be doped in the semiconductor substrate 110.

Hereinafter, an instance in which an impurity contained in the semiconductor substrate 110 is the second conductivity-type impurity and n type impurity will be described as an example. However, the present invention is not limited thereto.

The semiconductor substrate 110 may have a plurality of concavo-convex portions P400a on a front surface thereof. Thus, the first semiconductor part 121 positioned on the front surface of the semiconductor substrate 110 may also have a concavo-convex surface (or an irregular surface).

Accordingly, an amount of light reflected from the front surface of the semiconductor substrate 110 may be reduced to increase an amount of light incident to the inside of the semiconductor substrate 110.

In order to minimize reflection of light incident to the front surface of the semiconductor substrate 110 from the outside, the anti-reflective film 130 may be positioned on the front surface of the semiconductor substrate 110 and may be formed of at least one of an aluminum oxide film (AlOx), a silicon nitride film (SiNx), a silicon oxide film (SiOx), and a silicon oxynitride film (SiOxNy).

The tunnel layer 180 may be disposed to be in direct contact with the entirety of a rear surface of the semiconductor substrate 110 and include a dielectric material. Thus, as illustrated in FIGS. 5 and 6, the tunnel layer 180 may allow a carrier generated in the semiconductor substrate 110 to pass therethrough.

The tunnel layer 180 may allow a carrier generated in the semiconductor substrate 110 to pass therethrough and perform a passivation function with respect to the rear surface of the semiconductor substrate 110.

The tunnel layer 180 may be formed of a dielectric material such as SiCx or SiOx having strong durability even in a high temperature process at 600° C. or higher.

As illustrated in FIGS. 5 and 6, the first semiconductor part 121 may be disposed on a rear surface of the semiconductor substrate 110 and may be in direct contact with a portion of a rear surface of the tunnel layer 180.

The first semiconductor part 121 may be disposed on the rear surface of the semiconductor substrate 110 in the second direction (y) and may be formed of a polycrystalline silicon material having a first conductivity-type opposite to the second conductivity-type.

The first semiconductor part 121 may be doped with a first conductivity-type impurity, and in instances where an impurity contained in the semiconductor substrate 110 is a second conductivity-type impurity, the first semiconductor part 121 may form a p-n function with the semiconductor substrate 110 with the tunnel layer 180 interposed therebetween.

Since each of the first semiconductor parts 121 forms a p-n function with the semiconductor substrate 110, each of the first semiconductor parts 121 may have a p-type conductivity-type, and in instances where the plurality of first semiconductor parts 121 have the p-type conductivity-type, an impurity of a trivalent element may be doped in the first semiconductor parts 121.

The second semiconductor part 172 may be disposed to extend in the second direction (y) and alongside of the first semiconductor part 121 on a rear surface of the semiconductor substrate 110. For example, the second semiconductor part 172 may be formed to be in direct contact with a partial region of the rear surface of the tunnel layer 180 spaced apart from each of the first semiconductor parts 121 described above.

The second semiconductor part 172 may be formed of a polycrystalline silicon material doped with a second conductivity-type impurity with a concentration higher than that of the semiconductor substrate 110. Thus, for example, in instances where the semiconductor substrate 110 is doped with an n-type impurity, a second conductivity-type impurity, the plurality of second semiconductor parts 172 may be n+-type impurity regions.

The second semiconductor part 172 may hinder migration of holes in a direction toward the second semiconductor part 172 as a migration direction of electrons by a potential barrier due to a difference in impurity concentration between the semiconductor substrate 110 and the second semiconductor part 172, and facilitates carrier (e.g., electron) migration toward the second semiconductor part 172.

Thus, an amount of electric charges lost due to recombination of electrons and holes is reduced and electron mobility is accelerated in the second semiconductor part 172 and the vicinity thereof or in the first and second conductivity-type electrodes 141 and 142, to increase an amount of electron mobility to the second semiconductor part 172.

So far, the instance in which the semiconductor substrate 110 is the second conductivity-type impurity has been described as an example and the first semiconductor part 121 serves as an emitter part and the second semiconductor part 172 serves as a rear electric field part has been described with reference to FIGS. 5 and 6.

However, alternatively, in instances where semiconductor substrate 110 contains a first conductivity-type impurity, the first semiconductor part 121 may serve as a rear electric field part and the second semiconductor part 172 may serve as an emitter part.

Also, the instance in which the first semiconductor part 121 and the second semiconductor part 172 are formed of a polycrystalline silicon material and formed on the rear surface of the tunnel layer 180 has been described as an example, but, alternately, in instances where the tunnel layer 180 is omitted, the first semiconductor part 121 and the second semiconductor part 172 may be doped as an impurity is spread into the rear surface of the semiconductor substrate 110. In this instance, the first semiconductor part 121 and the second semiconductor part 172 may be formed of the same single crystal silicon material as that of the semiconductor substrate 110.

As illustrated in FIGS. 5 and 6, the intrinsic semiconductor part 150 may be formed on a rear surface of the tunnel layer 180 exposed between the first semiconductor part 121 and the second semiconductor part 172. Unlike the first semiconductor part 121 and the second semiconductor part 172, the intrinsic semiconductor part 150 may be formed as an intrinsic polycrystalline silicon layer not doped with a first conductivity-type impurity or a second conductivity-type impurity.

As illustrated in FIGS. 5 and 6, both sides of the intrinsic semiconductor part 150 may be directly in contact with a side of the first semiconductor part 121 and a side of the second semiconductor part 172.

The passivation layer 190 may remove a defect due to a dangling bond formed on a rear surface of the layer of the polycrystalline silicon material formed on the first semiconductor part 121, the second semiconductor part 172, and the intrinsic semiconductor part 150, serving to prevent carriers generated from the semiconductor substrate 110 from being recombined by the dangling bond to become extinct.

The plurality of first conductivity-type electrodes 141 may be connected to the first semiconductor part 121 and extend in the second direction (y). The first conductivity-type electrodes 141 may collect carriers, e.g., holes, which have migrated to the first semiconductor part 121.

The plurality of second conductivity-type electrodes 142 may be connected to the second semiconductor part 172 and extend in the second direction (y) in parallel to the first conductivity-type electrodes 141. The second conductivity-type electrodes 142 may collect carriers, e.g., electrons, which have migrated to the second semiconductor part 172.

In this manner, as illustrated in FIGS. 5 and 6, the first conductivity-type electrodes 141 and the second conductivity-type electrodes 142 may be alternately disposed in the first direction (x).

In the solar cells according to the present invention manufactured to have such a structure, the holes collected through the first conductivity-type electrodes 141 and the electrons collected through the second conductivity-type electrodes 142 may be used as power of an external device through an external circuit device.

The solar cells applied to the solar cell module according to the present invention are not limited to those illustrated in FIGS. 5 and 6, and any other components, except that the first and second conductivity-type electrodes 141 and 142 provided in the solar cells are formed on the rear surface of the semiconductor substrate 110, may be modified.

For example, an MWT type solar cell in which a portion of the first conductivity-type electrode 141 and the first semiconductor part 121 are positioned on a front surface of the semiconductor substrate 110 and the portion of the first conductivity-type electrode 141 is connected to the other remaining portion of the first conductivity-type electrode 141 formed on a rear surface of the semiconductor substrate 110 through a hole formed in the semiconductor substrate 110 may also be applied to the solar cell module of the present invention.

Figure 7:
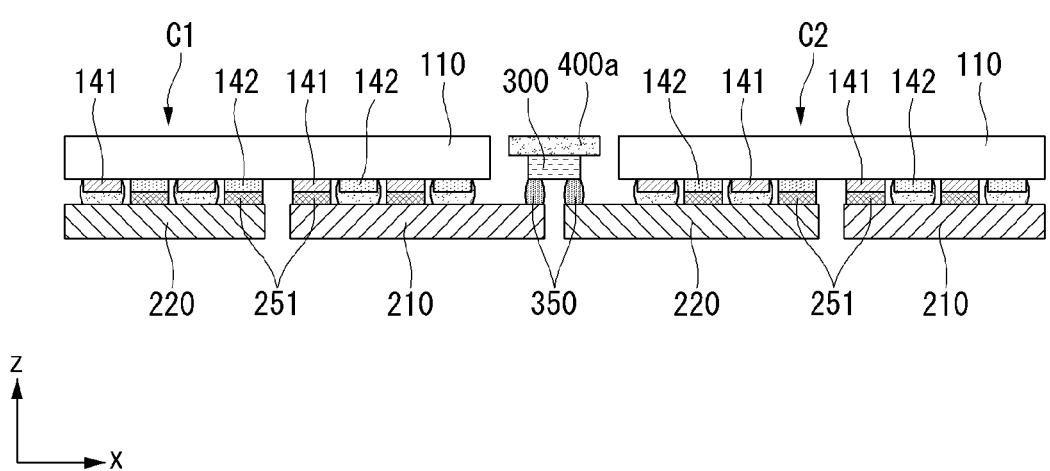

A cross-sectional structure in which the solar cells are connected in series using the first and second conductive lines 210 and 220 and the interconnectors 300 is illustrated in FIG. 7.

FIG. 7 is a cross-sectional view taken along line X1-X1 of FIGS. 4A and 4B.

As illustrated in FIG. 7, a plurality of solar cells including a first solar cell C1 and a second solar cell C2 may be arranged in the first direction (x).

Here, the first and second solar cells C1 and C2 may be disposed such that a longitudinal direction of the plurality of first and second conductivity-type electrodes 141 and 142 is the second direction (y) as illustrated in FIGS. 4B and 5.

With the first and second solar cells C1 and C2 arranged in the first direction (x), the first and second solar cells C1 and C2 may extend in the first direction (x) by the first conductive lines 210 and 220 and the interconnectors 300 so as to be connected in series to form a single string.

The plurality of first and second conductive lines 210 and 220 may have a conductive wire shape having a circular cross-section or may have a ribbon shape in which a width thereof is greater than a thickness thereof.

A line width of each of the first and second conductive lines 210 and 220 illustrated in FIGS. 4B and 7 may range from 0.5 mm to 2.5 mm in consideration of minimum manufacturing cost, while maintaining sufficiently low line resistance of the conductive lines, and a space between the first conductive line 210 and the second conductive line 220 may range from 4 mm to 6.5 mm such that a short-circuit current of the solar cell module is not damaged, in consideration of a total number of the first and second conductive lines 210 and 220.

The number of each of the first and second conductive lines 210 and 220 connected to one solar cell may be 10 to 20. Thus, a total number of the first and second conductive lines 210 and 220 connected to one solar cell may be 20 to 40.

As described above with reference to FIG. 1, the first and second conductive lines 210 and 220 may be connected to the first and second conductivity electrodes 141 and 142 formed on the rear surface of the semiconductor substrate 111 of each solar cell through the first conductive adhesive 251 or may be insulated by the insulating layer 252.

Here, the first conductive adhesive 251 may be formed of a metal including tin (Sn) or an alloy including tin (Sn). Also, the first conductive adhesive 251 may be formed as solder paste including tin (Sn) or an alloy including tin (Sn), or epoxy solder paste or conductive paste formed by including tin (Sn) or an alloy including tin (Sn) in an epoxy.

Here, any material may be used as a material of the insulating layer 252 as long as the material is an insulating material, for example, any one of insulating materials among an epoxy group, polyimide, polyethylene, an acrylic group, and a silicon group.

Also, end portions of each of the first and second conductive lines 210 and 220 connected to rear surfaces of the first and second solar cells C1 and C2 may be commonly connected to the interconnector 300 as illustrated in FIG. 7.

To this end, end portions of the plurality of first conductive lines 210 connected to the first solar cell C1 and end portions of the plurality of second conductive lines 220 connected to the second solar cell C2 may protrude to the outside of the semiconductor substrate 110 of each of the first and second solar cells C1 and C2 so as to overlap the interconnector 300.

Here, for example, as illustrated in FIG. 7, end portions of the first and second conductive lines 210 and 220 may overlap the interconnector 300 so as to be bonded to the interconnector 300 through a second conductive adhesive 350.

Here, the second conductive adhesive 350 bonding the first and second conductive lines 210 and 220 and the interconnector 300 may be formed of a metal including tin (Sn) or an alloy including tin (Sn).

In detail, the second conductive adhesive 350 may be formed as (1) solder paste including tin (Sn) or an alloy including tin (Sn), or as epoxy solder paste or conductive paste formed by including tin (Sn) or an alloy including tin (Sn) in an epoxy.

The second conductive adhesive 350 bonding the first and second conductive lines 210 and 220 and the interconnector 300 may be formed of a material which is the same as or different from that of the first conductive adhesive 251.

That is, when the second conductive adhesive 350 is formed of a material different from that of the first conductive adhesive 251, the second conductive adhesive 350 may be formed as solder paste including tin (Sn), and the first conductive adhesive 251 may be formed as epoxy solder paste or conductive paste including tin (Sn) or an alloy including tin (Sn).

Since the solar cell module having such a structure has the separate interconnector 300, if connection between the first and second conductive lines 210 and 220 and the first and second conductive electrodes 141 and 142 is defective in one of the plurality of solar cells, the connection between the interconnector 300 and the plurality of first and second conductive lines 210 and 220 is released and only the corresponding solar cell may be easily replaced.

Meanwhile, as illustrated in FIG. 7, the solar cell module according to an embodiment of the present invention may include a first shield 400a positioned on a front surface of the interconnector 300 and spaced apart from the semiconductor substrate 110 of each of the first and second solar cells C1 and C2, between the first and second solar cells C1 and C2.

This will be described in detail hereinafter.

Figure 8A:
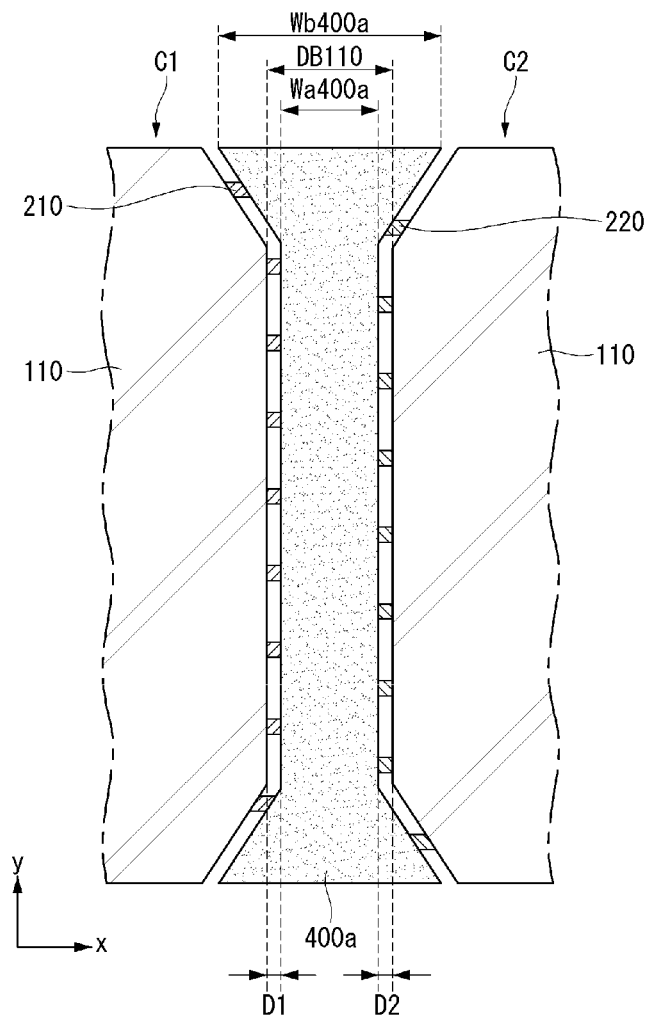
FIG. 8A is an enlarged front view of a part of a module where a first shield is positioned in FIG. 4A.
Figure 8B:
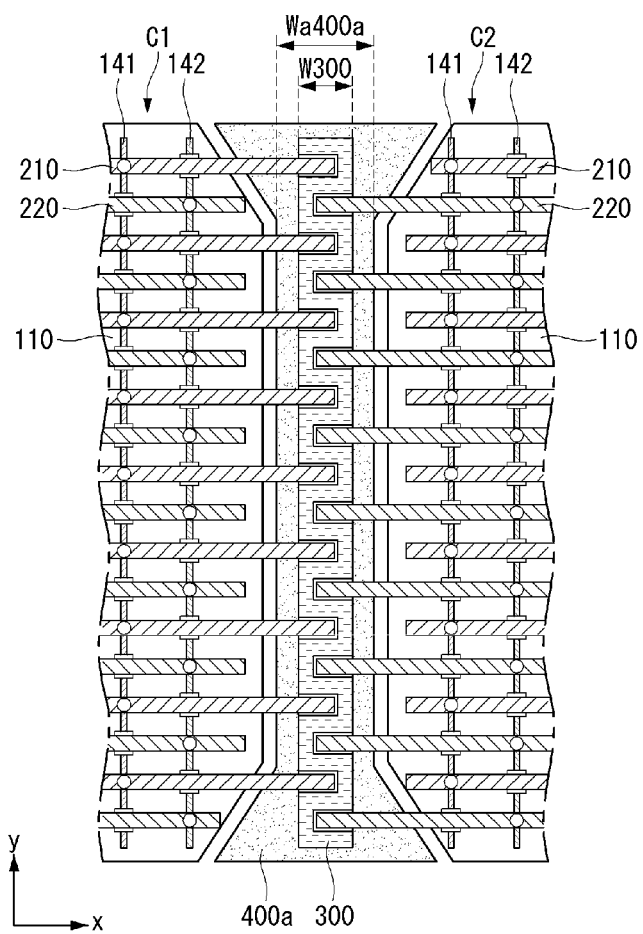
FIG. 8B is an enlarged rear view of a part of the module where the first shield is positioned in FIG. 4B.

FIG. 8A is an enlarged front view of a part of a module where the first shield 400a is positioned in FIG. 4A, and FIG. 8B is an enlarged rear view of a part of the module where the first shield 400a is positioned in FIG. 4B.

As illustrated in FIGS. 8A and 8B, the first shield 400a may be positioned on the interconnector 300 positioned between the first solar cell C1 and the second solar cell C2 and may be spaced apart from each of the semiconductor substrate 110 of the first solar cell C1 and the semiconductor substrate 110 of the second solar cell C2.

Here, the first shield 400a may be positioned between the first and second solar cells C1 and C2 in the second direction (y) crossing the first direction (x) in which the first and second solar cells C1 and C2 are connected in series.

Thus, the first shield 400a may visually block the interconnector 300 positioned between the first and second solar cells C1 and C2 in the first direction (x) in which the first and second solar cells C1 and C2 are connected in series, and may visually block portions of the first and second conductive lines 210 and 220 exposed between the first and second solar cells C1 and C2 in the first direction (x) in which the first and second solar cells C1 and C2 are connected in series.

In detail, as illustrated in FIG. 8A, when the solar cell mode is viewed from a front surface, the first shield 400a may be positioned outside a projection area of the semiconductor substrate 110 provided in each of the first and second solar cells C1 and C2. That is, the first shield 400a may be positioned in an outer area not overlapping the semiconductor substrate 110 provided in each of the first and second solar cells C1 and C2.

Also, as illustrated in FIGS. 4A and 8, in instances where the semiconductor substrate 110 is formed of a single crystal silicon wafer, a corner of the semiconductor substrate 110 has an area chamfered in a diagonal direction with respect to the first and second directions (x and y), and in consideration of this, a width Wb400a of a first portion of the first shield 400a may be formed to be greater than a central width Wa400a.

Here, the width Wb400a of the first portion of the first shield 400a may be increased toward both ends of the first shield 400a in consideration of a chamfered area of the semiconductor substrate 110 of each of the first and second solar cells C1 and C2.

Here, the first portion refers to a portion positioned between the chamfered areas of the semiconductor substrates 110 in a region between the first and second solar cells C1 and C2 as illustrated in FIG. 8A.

Thus, a maximum width Wb400a of the first portion of the first shield 400a may be larger than the central minimum width Wa400a of the first shield 400a or a minimum space DB110 between the first and second solar cells C1 and C2 and smaller than a maximum space between the chamfered areas of the first and second solar cells C1 and C2.

In FIGS. 8A and 8B, the minimum space DB110 between the semiconductor substrates 110 of the first and second solar cells C1 and C2 may be, for example, 3.8 mm to 4.2 mm.

Also, unlike the first shield 400a, a width W300 of the interconnector 300 may be the same along the second direction (y) and may be smaller than the minimum width Wa400a of the first shield 400a. For example, the width W300 of the interconnector 300 may be, for example, 1 mm to 2 mm.

A minimum space between each of the semiconductor substrates 110 of the first and second solar cells C1 and C2 and the interconnector 300 may be 1 mm to 2 mm, and the sum of the minimum space between the semiconductor substrate 110 of the first solar cell C1 and the interconnector 300 and the minimum space between the semiconductor substrate 110 of the second solar cell C2 and the interconnector 300 may be 2 mm to 3 mm.

The minimum width Wa400a of the first shield 400a may be smaller than the minimum space DB110 between the first and second solar cells C1 and C2 and larger than the width W300 of the interconnector 300.

For example, the minimum width Wa400a of the first shield 400a may be 2.8 mm to 3.2 mm.

Accordingly, the interconnector 300 may fully overlap a rear surface of the first shield 400a and completely covered by the first shield 400a when viewed from a front surface of the solar cell module.

The sum (D1+D2) of minimum spaces between the first shield 400a and each of the semiconductor substrates 110 respectively provided in the first and second solar cells C1 and C2 may be 0.6 mm to 1.4 mm.

That is, the sum (D1+D2) of the minimum space D1 between the first shield 400a and the first solar cell C1 and the minimum space D2 between the first shield 400a and the second solar cell C2 may be 0.6 mm to 1.4 mm.

Here, a cross-section of the first shield 400a will be described in detail as follows.

Figure 9:
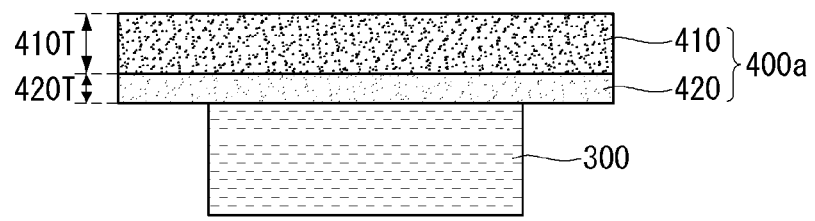
FIG. 9 is a cross-sectional view specifically illustrating a first shield applied according to an embodiment of the invention.

FIG. 9 is a cross-sectional view specifically illustrating the first shield 400a applied according to an embodiment of the present invention.

As illustrated in FIG. 9, the first shield 400a may cohere to a front surface of the interconnector 300 so as to be provided.

Here, the first shield 400a may include a substrate 410 formed of an insulating material and a cohesion layer 420 positioned on a rear surface of the substrate 410 facing the interconnector 300 and cohering to the interconnector 300.

Here, the base 410 serves to form a body of the first shield 400a, and the cohesion layer 420 may serve to cohere the substrate 410 to a front surface of the interconnector 300. Here, cohesion refers to adhesive strength with which two layers may cohere to each other or be separated from each other by a physical force at room temperature. Thus, cohesion has a meaning different from that of adhesion allowing two layers to be bonded through a heat treatment and causing any one layer to be damaged when the two layers are separated.

In this manner, since the first shield 400a of the present invention has the cohesion layer 420, in instances where the first shield 400a does not adhere to a desired position of the interconnector 300 during a manufacturing process, the first shield 400a may be separated from the interconnector 300 and cohere to a desired position again.

Here, the substrate 410 may be formed of an insulating material, for example, polyethylene terephthalate (PET). The cohesion layer 420 may be formed of at least one of an epoxy group, an acrylic group, and a silicone group.

A thickness 410T of the substrate 410 may range from 50 um to 70 um in consideration of a thickness of the semiconductor substrate 110 and the interconnector 300, and a thickness 420T of the cohesion layer 420 may range from 10 um to 30 um in consideration of cohesion strength of the cohesion layer 420 and a thickness of the substrate 410.

Thermal strain of the first shield 400a may be 10% or less at 180° C. or lower. This is to minimize deformation of the first shield 400a during a lamination process which may be performed at temperatures of 160° C. to 170° C. in a state in which the first shield 400a coheres between the first and second solar cells C1 and C2.

Also, since the first shield 400a is positioned between the first and second solar cells C1 and C2, a light reflective structure may be provided on a front surface of the first shield 400a in order to maximize an optical gain of the solar cell module.

Figure 10:
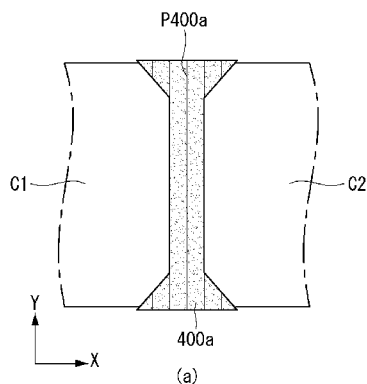
FIG. 10 is a view specifically illustrating a light reflective structure of a first shield applied according to an embodiment of the invention.
Figure 10:
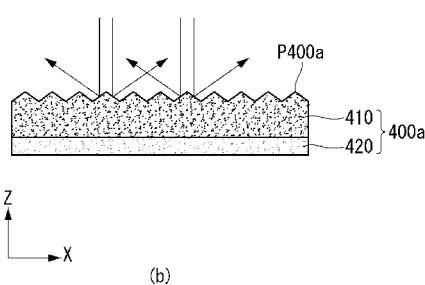
Figure 10:
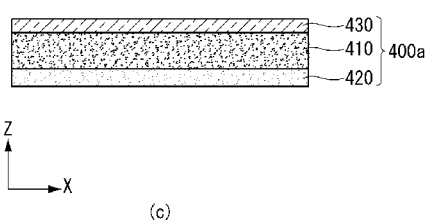

FIG. 10 is a view specifically illustrating a light reflective structure of the first shield 400a applied according to an embodiment of the present invention.

In FIG. 10, (a) is a front view of the first shield 400a illustrating an example of a light reflective structure of the first shield 400a, (b) is a cross-sectional view of the first shield 400a with a light reflective structure, and (c) is a cross-sectional view of the first shield 400a illustrating another example of the light reflective structure.

As illustrated in FIG. 10, the first shield 400a according to the present invention may have a light reflective structure provided on a front surface thereof in order to maximize an optical gain of the solar cell module.

For example, as illustrated in (a) and (b) of FIG. 10, a plurality of concavo-convex portions P400a may be provided on a front surface, a light receiving surface, of the substrate 410 included in the first shield 400a.

Here, the plurality of concavo-convex portions P400a formed on the front surface of the first shield 400a may be formed such that convex portions and concave portions of the concavo-convex portions P400a extend in the second direction (y), and such that sloped surfaces formed between the convex portions and concave portions are oriented in the direction of the first and second solar cells C1 and C2.

Thus, as illustrated in (b) of FIG. 10, when light is incident to the front surface of the first shield 400a, the concavo-convex portions of the first shield 400a may reflect light toward the first and second solar cells C1 and C2 adjacent to each other in the first direction (x) to enhance light receiving efficiency of the first and second solar cells C1 and C2.

Or, as illustrated in (c) of FIG. 10, a light reflective layer 430 including light reflective particles (e.g., $TiO_2$) or a metal (e.g., aluminum) may be positioned on the front surface, a light receiving surface, of the substrate 410. A planar shape of the light-reflective layer 430 may be the same as that of the substrate 410.

As illustrated in FIG. 10, the first shield 400a may have a planar shape different from that of the interconnector 300. Hereinafter, a difference in shape between the first shield 400a and the interconnector 300 will be comparatively described.

Figure 11:
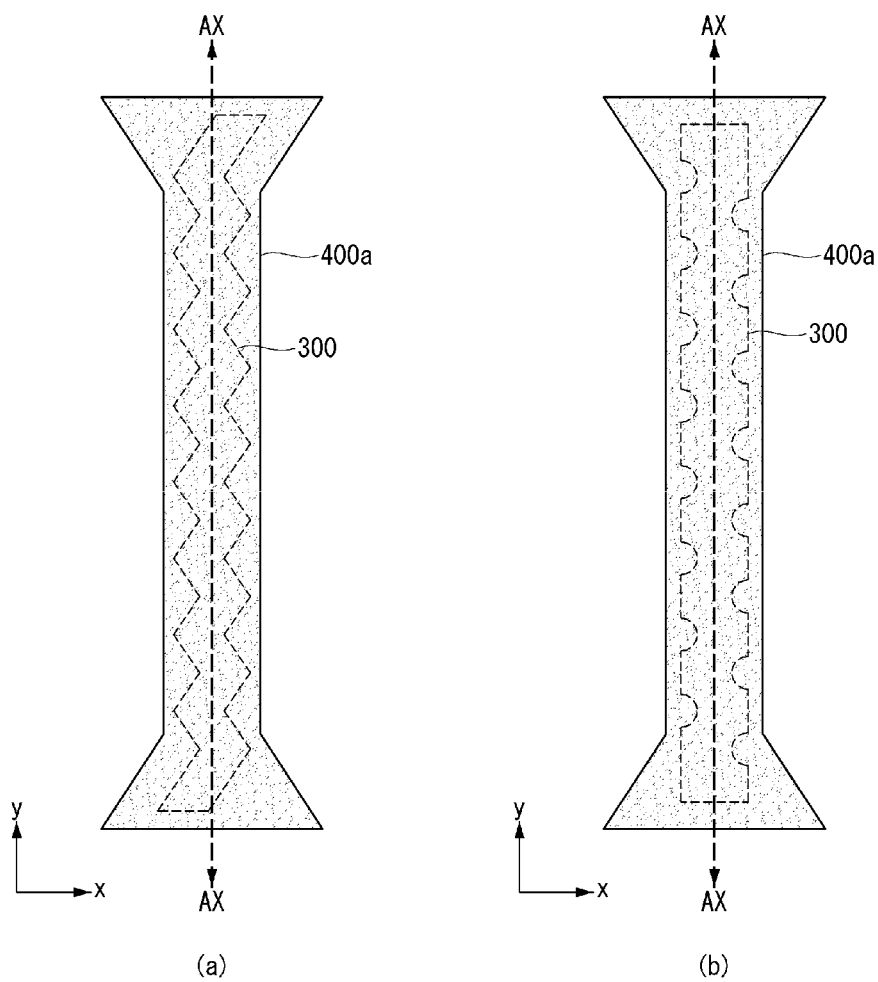
FIG. 11 is a view illustrating a comparison between planar shapes of a first shield applied according to an embodiment of the invention and an interconnector.

FIG. 11 is a view illustrating a comparison between planar shapes of the first shield 400a applied according to an embodiment of the present invention and the interconnector 300.

As illustrated in FIG. 11, the interconnector 300 completely overlaps the first shield 400a, and a planar shape of the first shield 400a may be different from that of the interconnector 300.

In detail, as illustrated in (a) and (b) of FIG. 11, the interconnector 300 may fully overlap the first shield 400a, and a planar shape of the first shield 400a may be different from that of the interconnector 300.

In detail, as illustrated in (a) and (b) of FIG. 11, the first shield 400a may have a planar shape in which both sides thereof are symmetrical with respect to a central axis AX extending in the second direction (y), but, compared with the first shield 400a, the interconnector 300 may have a planar shape in which both sides thereof are asymmetrical with respect to the central axis AX, for example, a zigzag shape as illustrated in (a) of FIG. 11 or a shape in which sides of the interconnector 300 are alternately depressed in different positions in the second direction (y) as illustrated in (b) of FIG. 11.

In this manner, although the planar shape of the interconnector 300 is different from that of the first shield 400a, since the first shield 400a according to the present invention has a minimum width Wa400a completely covering the interconnector 300, visually blocking the interconnector 300 to make the appearance of the solar cell module neater and more appealing.

A cross-sectional structure in which the first shield 400a coheres to the interconnector 300 is as follows.

Figure 12:
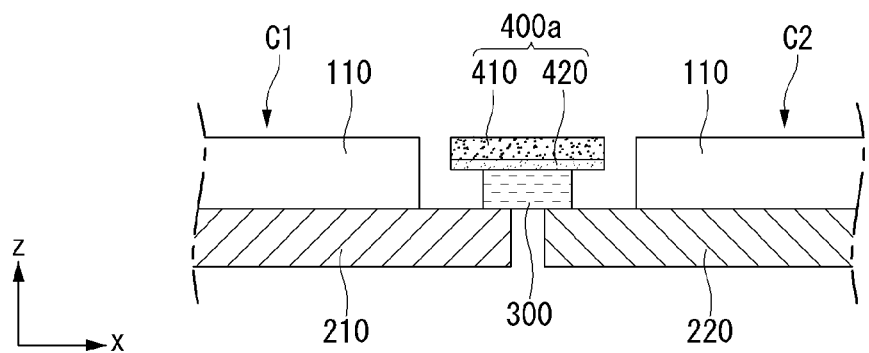
FIG. 12 is a cross-sectional view specifically illustrating a structure in which a first shield applied according to an embodiment of the invention coheres to an interconnector.
Figure 12:
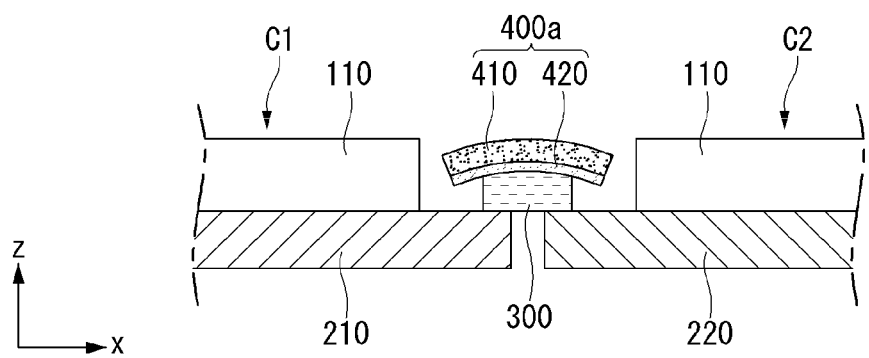

FIG. 12 is a cross-sectional view specifically illustrating a structure in which the first shield 400a applied according to an embodiment of the present invention coheres to the interconnector 300.

In FIG. 12, for the purposes of description, the first and second conductivity-type electrodes 141 and 142, the first and second conductive adhesives 251 and 350, and the insulating layer 252 of the first and second solar cells C1 and C2 are omitted, but the structure of FIG. 12 is the same as that of FIG. 7, based on which the structure of FIG. 12 will be described.

As illustrated in (a) of FIG. 12, the first shield 400a coheres to the interconnector 300, and here, the first shield 400a having a structure in which the substrate 410 is positioned on a front surface of the interconnector 300 and the cohesion layer 420 coheres the substrate 410 and the interconnector 300 to each other may be applied.

The substrate 410 and the cohesion layer 420 of the first shield 400a may be flat in the first direction (x) as illustrated in (a) of FIG. 12 or may be bent at both ends thereof toward the interconnector 300 as illustrated in (b) of FIG. 12.

When both ends of the first shield 400a are bent toward the interconnector 300, light incident to the first shield 400a may be more effectively reflected toward the semiconductor substrates 110 of the first and second solar cells C1 and C2 adjacent to each other.

The first shield 400a positioned between two adjacent solar cells may be provided in plurality in an overlapping manner. This will be described in detail hereinafter.

Figure 13:
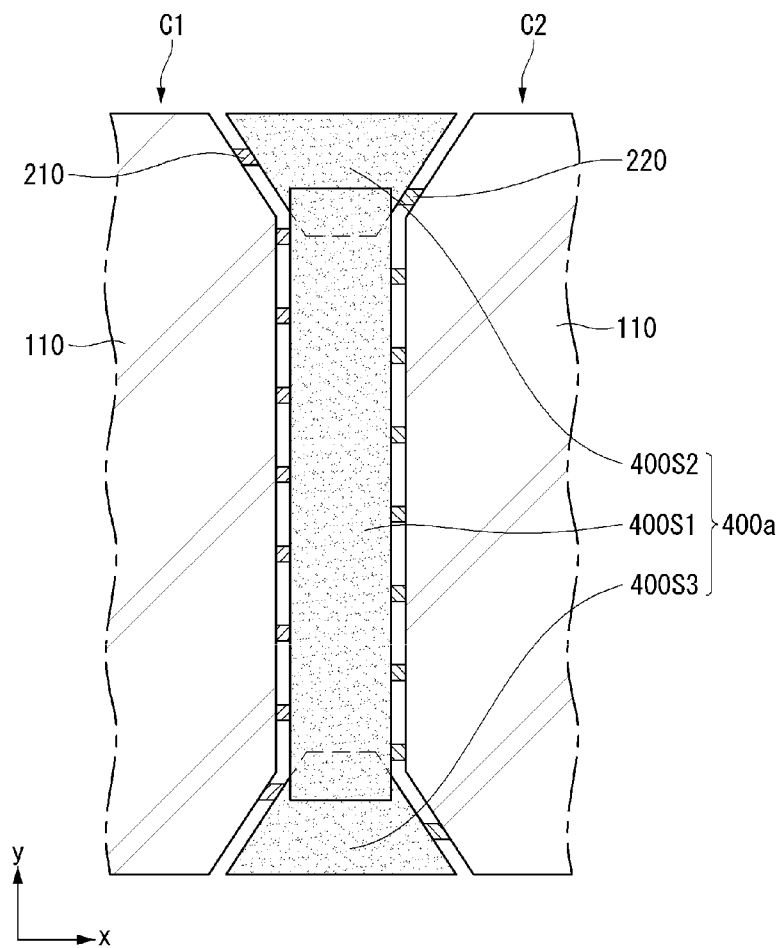
FIG. 13 is a view illustrating an example in which a shield applied according to an embodiment of the invention includes a plurality of sub-shields.

FIG. 13 is a view illustrating an example in which a shield applied according to an embodiment of the present invention includes a plurality of sub-shields.

As illustrated in FIG. 13, the first shield 400a positioned to be spaced apart from two adjacent solar cells C1 and C2 between the two adjacent solar cells C1 and C2 may include first, second, and third sub-shields 400S1, 400S2, and 400S3 provided in an overlapping manner.

In detail, each of the first, second, and third sub-shields 400S1, 400S2, and 400S3 may be spaced apart from the semiconductor substrate 110 of each of the solar cells C1 and C2, and the first, second, and third sub-shields 400S1, 400S2, and 400S3 may overlap each other in the second direction (y).

Here, the first sub-shield 400S1 may have a uniform line width and extend in the second direction (y).

The second and third sub-shields 400S2 and 400S3 may be positioned at one and the other ends of the first sub-shield 400S1 in the second direction (y) and overlap the first sub-shield 400S1.

Here, a maximum width of the second and third sub-shields 400S2 and 400S3 may be smaller than a space between the two solar cells C1 and C2 and larger than a line width of the first sub-shield 400S1.

Also, minimum widths of the second and third sub-shields 400S2 and 400S3 may be smaller than a line width of the first sub-shield 400S1, and the widths of the second and third sub-shields 400S2 and 400S3 may be gradually decreased toward the first sub-shield 400S1.

Figure 14:
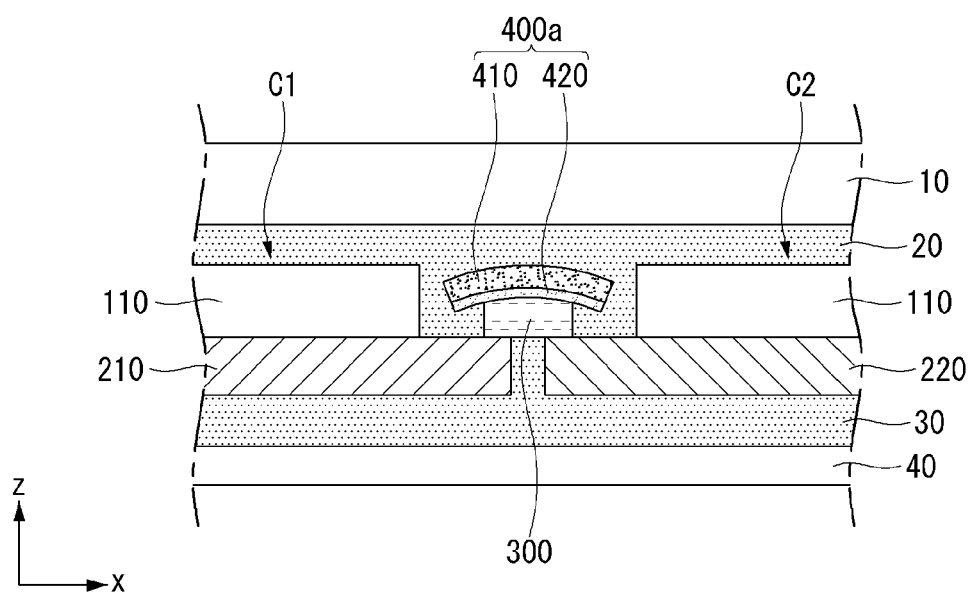
FIG. 14 is a cross-sectional view of a solar cell module encapsulated through a lamination process according to an embodiment of the invention.

FIG. 14 is a cross-sectional view of a solar cell module encapsulated through a lamination process according to an embodiment of the present invention.

As illustrated in FIG. 14, the first and second solar cells C1 and C2 in a state of being disposed between the front transparent substrate 10 and the rear sheet 40 may be integrated and encapsulated by heat and pressure applied during a lamination process.

In a state in which the first shield 400a cohering to the front surface of the interconnector 300 as illustrated in (a) of FIG. 12, when the lamination process is performed, both ends of the first field 400a in the first direction (x) are bent toward a rear surface of the module where the interconnector 300 is positioned as an upper filler 20 is spread during the lamination process as illustrated in FIG. 14.

Also, a light receiving surface of the first shield 400a may have the same color or the same group color as that of the rear sheet 40 positioned on the rear surface of the solar cell, so that the appearance of the module is neat.

For example, when the rear sheet 40 is white, the light receiving surface of the first shield 400a may be white or a white group, and when the rear sheet 40 is black, the light receiving surface of the first shield 400a may be black or dark blue similar to black.

In this manner, in the solar cell module according to the present invention, since the first shield 400a is positioned on the front surface of the interconnector 300 between the first and second solar cells C1 and C2 and spaced apart from the first and second solar cells C1 and C2, the appearance of the solar cell module may be neater and more appealing.

So far, the instance in which the first shield 400a is spaced apart from the semiconductor substrates 110 of the adjacent solar cells in the solar cell module according to the present invention has been described as an example, but it may also be configured such that at least one of both sides of the first shield 400a in the first direction (x) overlaps the semiconductor substrate 110 of the adjacent solar cell.

This will be described in detail.

FIGS. 15A to 17B are views illustrating a solar cell module according to another embodiment of the present invention.

Figure 15A:
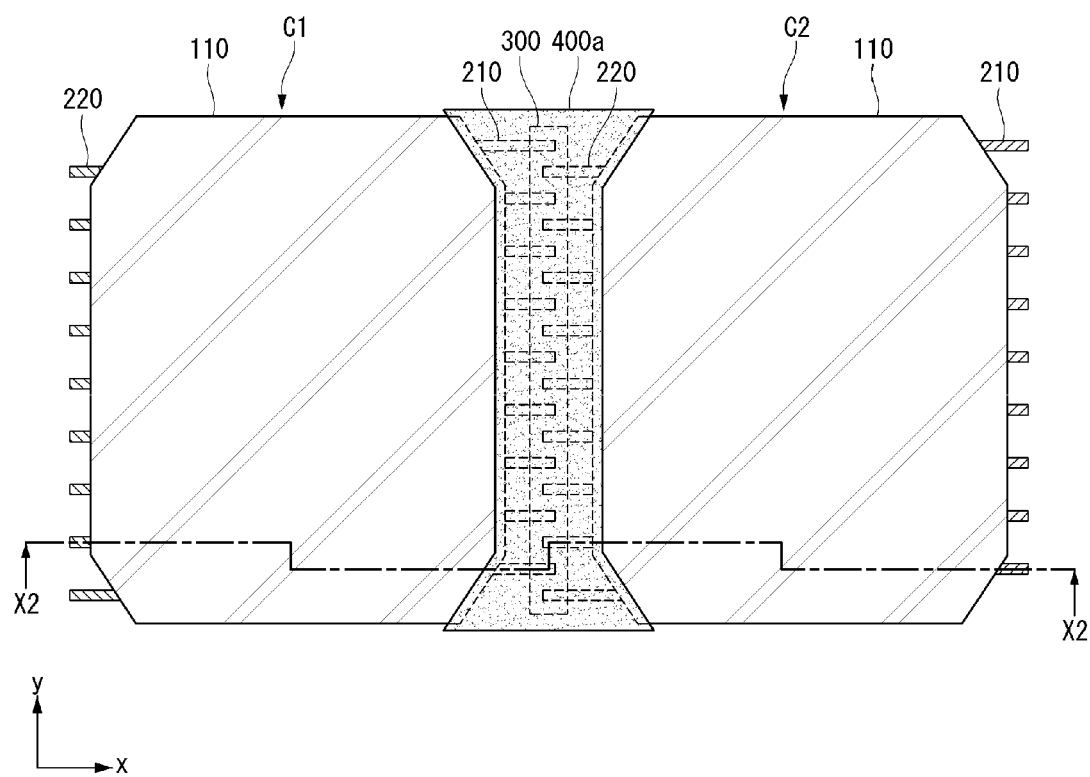
FIGS. 15A to 17B are views illustrating a solar cell module according to another embodiment of the invention.
Figure 15B:
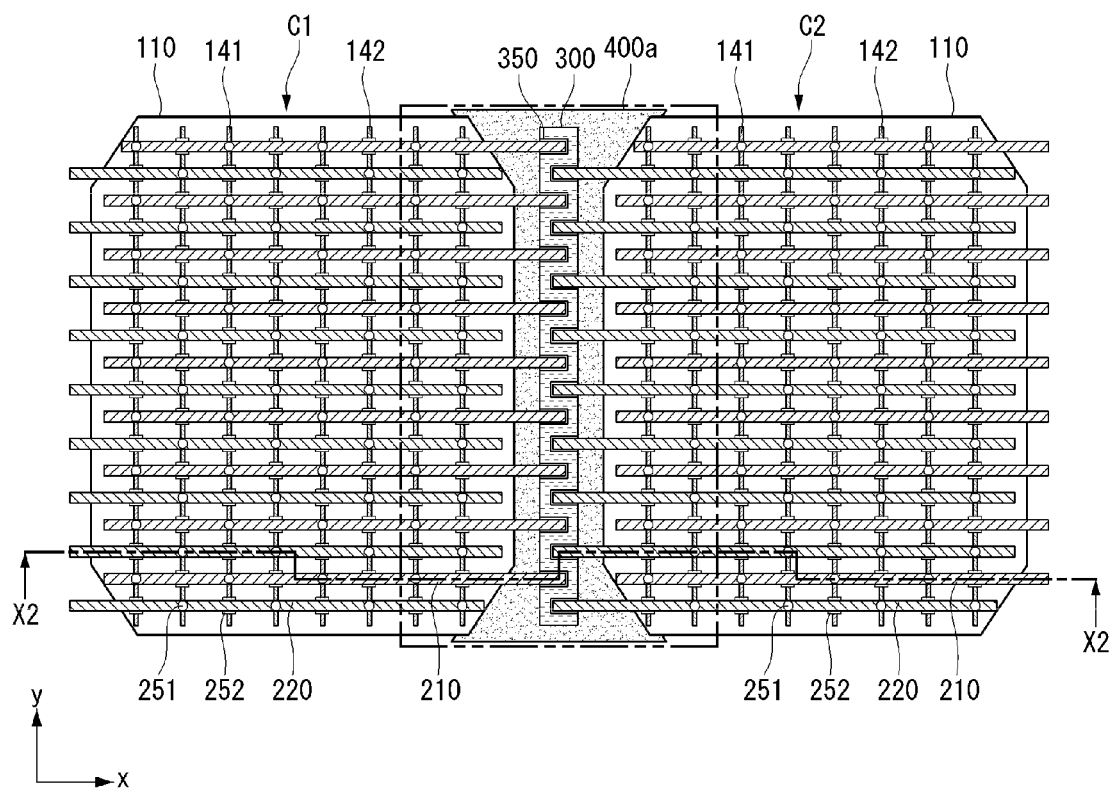
Figure 16:
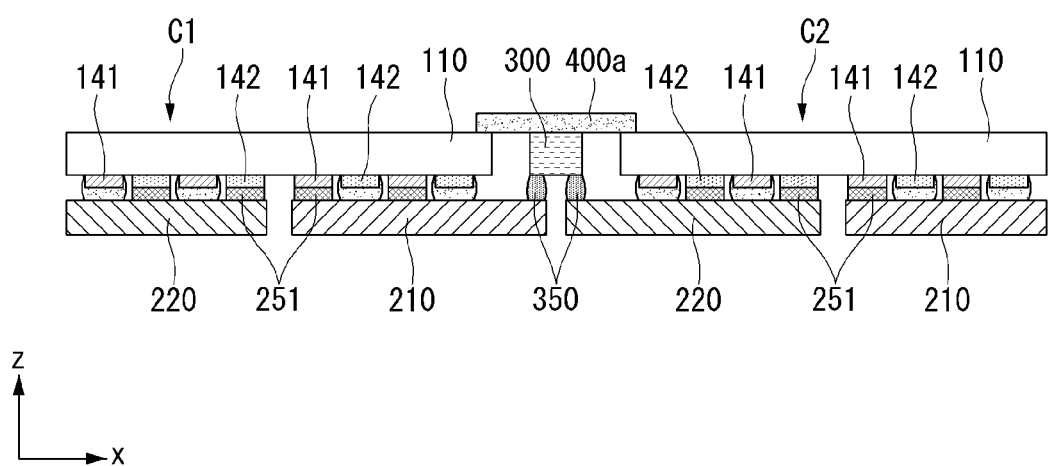

Specifically, FIG. 15A is a view illustrating a front surface of a solar cell module according to another embodiment, FIG. 15B is a view illustrating a rear surface of the solar cell module according to another embodiment, and FIG. 16 is a cross-sectional view taken along line X2-X2 of FIG. 15B.

As illustrated in FIGS. 15A, 15B, and 16, in the solar cell module according to another embodiment of the present invention, the first shield 400a may be positioned on the front surface of the interconnector 300 in an overlapping manner in the second direction (y) and coheres to a front surface of an edge area of at least one of the semiconductor substrates provided in the first and second solar cells C1 and C2.

Here, the edge area of the semiconductor substrate 110 may be a side surface of the semiconductor substrate 110 adjacent to the interconnector 300, that is, an edge surface of the semiconductor substrate 110 parallel to the second direction (y), and the front surface of the edge area may be a front surface area adjacent to the side surface of the semiconductor substrate 110 described above That is, the edge area of the semiconductor substrate 110 may be an area adjacent to the edge surface of the semiconductor substrate 110 parallel to the second direction (y), a longitudinal direction of the interconnector 300.

As illustrated in FIGS. 15A, 15B, and 16, in instances where a crystalline silicon wafer is used as the semiconductor substrate 110, a portion of the semiconductor substrate 110 where the edge of the semiconductor substrate in the first direction (x) and the edge of the semiconductor substrate 110 in the second direction (y) meet includes a region chamfered in a diagonal direction crossing the first and second directions (x and y) in terms of manufacturing the crystalline silicon wafer, and here, the first shield 400a may cohere to overlap the portion where edge in the diagonal direction crossing the first and second directions (x and y) and the edge in the first direction (x) meet.

In this manner, the first shield 400a according to another embodiment of the present invention may be provided in various following forms in the solar cell module.

In instance (1), a single first shield 400a may be provided on the front surface of the interconnector 300 positioned between the first and second solar cells C1 and C2 and overlap the front edge areas of the semiconductor substrates 110 of the first and second solar cells C1 and C2, or in instance (2), a single first shield 400*a* may overlap the front edge area of the semiconductor substrate 110 of any one of the first and second solar cells C1 and C2 and may be spaced apart from the semiconductor substrate 110 of the other solar cell.

Alternatively, in instance (3), two first shields 400*a* may be provided to be spaced apart from each other in the first direction (x) on the front surface of the interconnector 300 positioned between the first and second solar cells C1 and C2.

The first shield 400*a* will be described in detail on the basis of instance (1) as a basic configuration with reference to FIGS. 15A to 19, and instance (2) and instance (3) will be described later with reference to FIGS. 20 and 21, respectively.

As illustrated in FIGS. 15A, 15B, and 16, in instances where a single first shield 400*a* is provided on a front surface of the interconnector 300 positioned between the first and second solar cells C1 and C2, the single first shield 400*a* may cohere to overlap the front edge area of the semiconductor substrate 110 of the first solar cell C1 and the front edge area of the semiconductor substrate 110 of the second solar cell C2.

The first shield 400*a* may cohere to overlap the front edge areas of the semiconductor substrates 110 of the first and second solar cells C1 and C2 to prevent occurrence or spreading of crack in the edge areas of the semiconductor substrates 110 of the solar cell module during a manufacturing process.

The instance in which the single first shield 400*a* overlaps the front edge areas of the semiconductor substrates 110 of the first and second solar cells C1 and C2 will be described in detail.

Figure 17A:
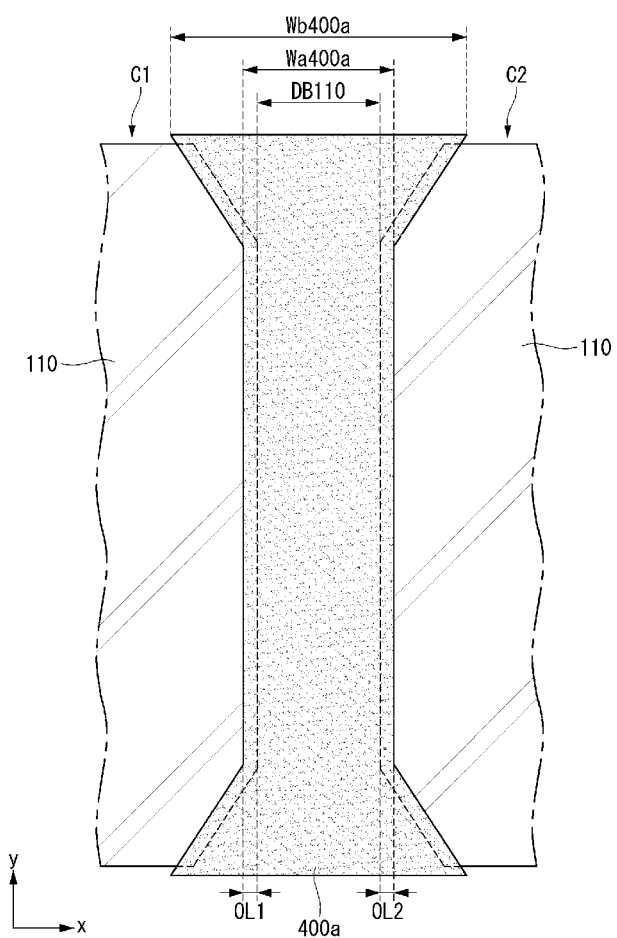
Figure 17B:
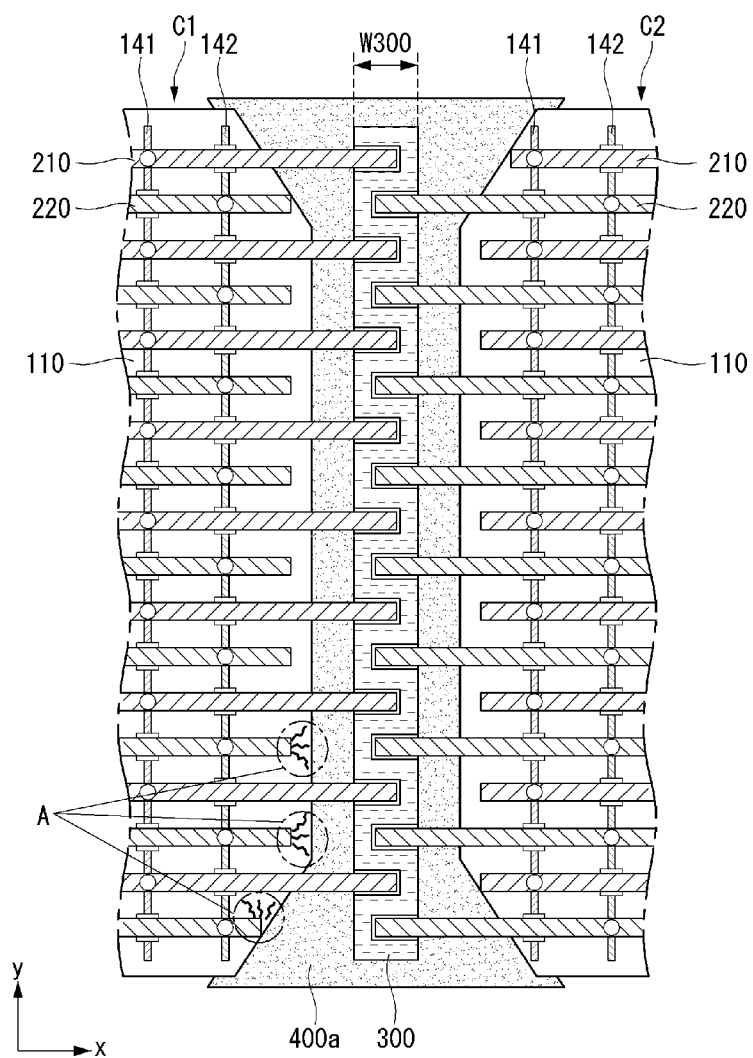

FIG. 17A is an enlarged front view illustrating a portion of the module in which the first shield 400*a* is positioned in FIG. 15A, and FIG. 17B is an enlarged rear view illustrating a portion of the module in which the first shield 400*a* is positioned in FIG. 15B, As illustrated in FIGS. 17A and 17B, the single first shield 400*a* may be provided between the first solar cell and the second solar cell and cohere to the front edge area of the semiconductor substrate 110 of the first solar cell and the front edge area of the semiconductor substrate 110 of the second solar cell in an overlapping manner.

Thus, as illustrated in FIG. 17A, when viewed from a front surface of the semiconductor substrate 110, the first shield 400*a* may be positioned to cover the front edge area of the semiconductor substrate 110 of the solar cell parallel to the second direction (y) and the front edge area of the semiconductor substrate 110 of the second solar cell parallel to the second direction (y).

Here, a central axis of the first shield 400*a* may be positioned between the first and second solar cells C1 and C2 and extend in the second direction (y) crossing the first direction (x) in which the first and second solar cells C1 and C2 are connected in series. Accordingly, the first shield 400*a* may visually block the interconnector 300 positioned between the first and second solar cells C1 and C2 in the first direction (x) in which the first and second solar cells C1 and C2 are connected in series, and may visually block the first and second conductive lines 210 and 220 exposed in the first direction (x) in which the first and second solar cells C1 and C2 are connected in series.

Also, in instances where the semiconductor substrate 110 is formed of a single crystal silicon wafer, Also, as illustrated in FIGS. 15A and 17A, in instances where the semiconductor substrate 110 is formed of a single crystal silicon wafer, a corner of the semiconductor substrate 110 has an area chamfered in a diagonal direction with respect to the first and second directions (x and y), and in consideration of this, a width Wb400*a* of a first portion of the first shield 400*a* may be formed to be greater than a central width Wa400*a*.

Here, the width Wb400*a* of the first portion of the first shield 400*a* may be increased toward both ends of the first shield 400*a* in consideration of a chamfered area of the semiconductor substrate 110 of each of the first and second solar cells C1 and C2.

Also, a maximum width Wb400*a* of the first portion of the first shield 400*a* may be larger than the central minimum width Wa400*a* of the first shield 400*a*, a minimum space DB110 between the first and second solar cells C1 and C2, a maximum space between the chamfered areas of the first and second solar cells C1 and C2.

In FIGS. 17A and 17B, the minimum space DB110 between the semiconductor substrates 110 of the first and second solar cells C1 and C2 may be, for example, 3.8 mm to 4.2 mm.

Also, unlike the first shield 400*a*, a width W300 of the interconnector 300 may be the same along the second direction (y) and may be smaller than the minimum width Wa400*a* of the first shield 400*a*. For example, the width W300 of the interconnector 300 may be, for example, 1 mm to 2 mm.

A minimum space between each of the semiconductor substrates 110 of the first and second solar cells C1 and C2 and the interconnector 300 may be 1 mm to 2 mm, and the sum of the minimum space between the semiconductor substrate 110 of the first solar cell C1 and the interconnector 300 and the minimum space between the semiconductor substrate 110 of the second solar cell C2 and the interconnector 300 may be 2 mm to 3 mm.

The minimum width Wa400*a* of the first shield 400*a* may be larger than the width W300 of the interconnector 300 and the minimum space DB110 between the first and second solar cells C1 and C2. For example, the minimum width Wa400*a* of the first shield 400*a* may be 4 mm to 6 mm.

Accordingly, as illustrated in FIG. 17A, the first shield 400*a* may cover front edge areas of the semiconductor substrates 110 of the first and second solar cells C1 and C2 and the interconnector 300 may completely overlap the rear surface of the first shield 400*a*, and thus, the interconnector 300 may be completely covered by the first shield 400*a* when viewed from a front surface of the solar cell module.

Also, widths OL1 and OL2 by which the first shield 400*a* overlaps the front edge areas of the semiconductor substrates 110 of the first and second solar cells C1 and C2 may be 0.1 mm to 2 mm, and the sum of the overlapping widths OL1 and OL2 may be 0.2 mm to 3 mm.

In this manner, since the first shield 400*a* coheres to overlap the front edge areas of the semiconductor substrates 110 respectively provided in the first and second solar cells C1 and C2, occurrence or spreading of cracks (A) may be prevented in the edge areas of the semiconductor substrates 110 of the solar cell module during a manufacturing process.

In more detail, in the solar cell module according to the present invention, the first and second conductive lines 210 and 220 may be connected to a rear surface of the semiconductor substrate 110. Here, for example, the first conductive line 210 may protrude outwardly from the semiconductor substrate 110 so as to be connected to the interconnector 300, while an end of the second conductive line 220 of the first solar cell C1 is positioned in the edge area of the semiconductor substrate 110.

In instances where the end of the conductive line is positioned in the edge of the semiconductor substrate 110, if a slight impact is applied to the solar cell during the manufacturing process of the module or while the module is being moved after the module is completed, the edge area of the semiconductor substrate 110 in which an end of the conductive line is positioned may be cracked, and here, due to the characteristics of crack which continuously spreads once occurs, the corresponding solar cell with cracks may not be able to perform a proper function.

However, when the first shield 400a positioned on the front surface of the interconnector 300 coheres to the front edge areas of the semiconductor substrates 110 of the first and second solar cells C1 and C2, although an impact is applied during the manufacturing process of the module or while the module is being moved after the module is completed, the first shield 400a may alleviate the impact to significantly reduce the possibility of occurrence of crack (A) as illustrated in FIG. 17B, and in addition, although cracks (A) occur, spreading of the cracks (A) may be effectively prevented due to the first shield 400a cohering to the front edge area of the semiconductor substrate 110.

Figure 18:
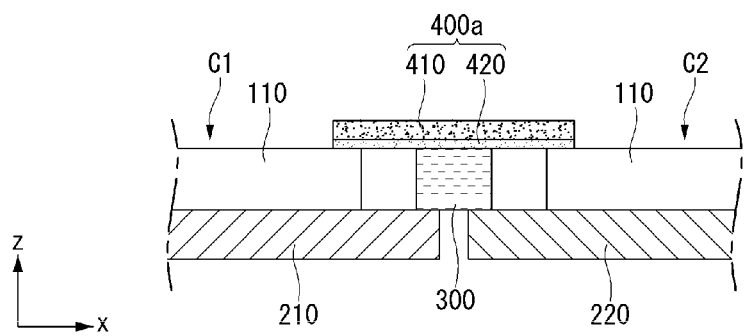
FIG. 18 is a cross-sectional view specifically illustrating a structure in which a first shield applied according to an embodiment of the invention coheres to an interconnector.
Figure 18:
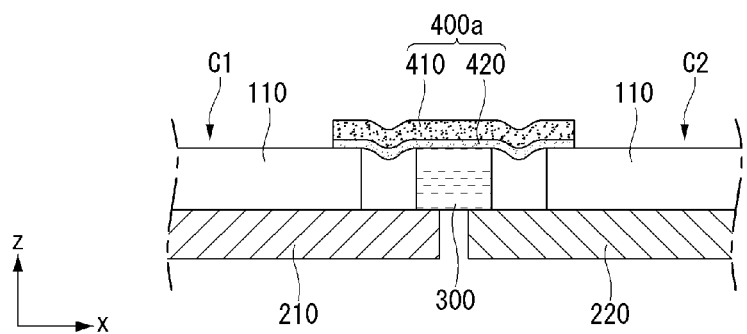

FIG. 18 is a cross-sectional view specifically illustrating a structure in which the first shield 400a applied according to an embodiment of the present invention coheres to the interconnector 300.

In FIG. 18, for the purposes of description, the first and second conductivity-type electrodes 141 and 142, the first and second conductive adhesives 251 and 350, and the insulating layer 252 of the first and second solar cells C1 and C2 are omitted, but the structure of FIG. 18 is the same as that of FIG. 16, based on which the structure of FIG. 18 will be described.

As illustrated in (a) of FIG. 18, the first shield 400a coheres to a front surface of the interconnector 300 and the front edge areas of the semiconductor substrates 110 of the first and second solar cells C1 and C2, and the first shield 400a having a structure in which the substrate 410 is positioned in a direction of a front surface of the module and the cohesion layer 420 coheres to the interconnector 300 and the front edge areas of the semiconductor substrates 110 of the first and second solar cells C1 and C2.

Here, the substrate 410 and the cohesion layer 420 of the first shield 400a may be flat in the first direction (x) as illustrated in (a) of FIG. 18 or may be bent at both ends thereof toward the interconnector 300 as illustrated in (b) of FIG. 12.

As illustrated in (b) of FIG. 18, portions of the first shield 400a not overlapping the interconnector 300 and the semiconductor substrates 110 of the first and second solar cells C1 and C2 may be depressed toward a rear surface of the module.

Figure 19:
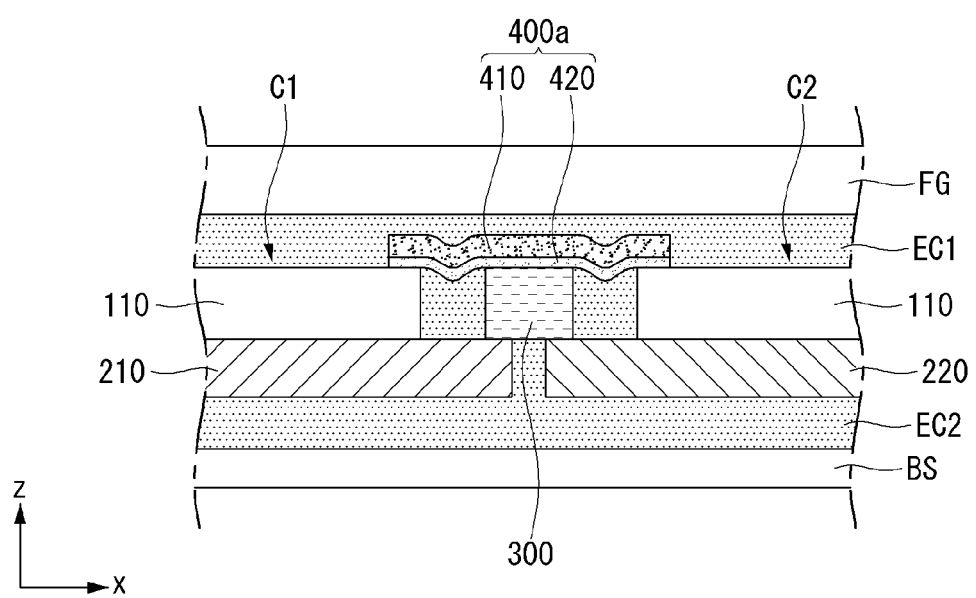
FIG. 19 is a cross-sectional view of a solar cell module encapsulated through a lamination process according to an embodiment of the invention.

FIG. 19 is a cross-sectional view of a solar cell module encapsulated through a lamination process according to an embodiment of the present invention.

As illustrated in FIG. 19, the first and second solar cells C1 and C2 in a state of being disposed between the front transparent substrate 10 and the rear sheet 40 may be integrated and encapsulated by heat and pressure applied during a lamination process.

In a state in which the first shield 400a cohering to the front surface of the interconnector 300 as illustrated in (a) of FIG. 18, when the lamination process is performed, portions of the first shield 400a not overlapping the interconnector 300 and the semiconductor substrates 110 of the first and second solar cells C1 and C2 may be depressed toward a rear surface of the module due to spreading pressure of an upper filler 20 during the lamination process as illustrated in FIG. 19.

Figure 20:
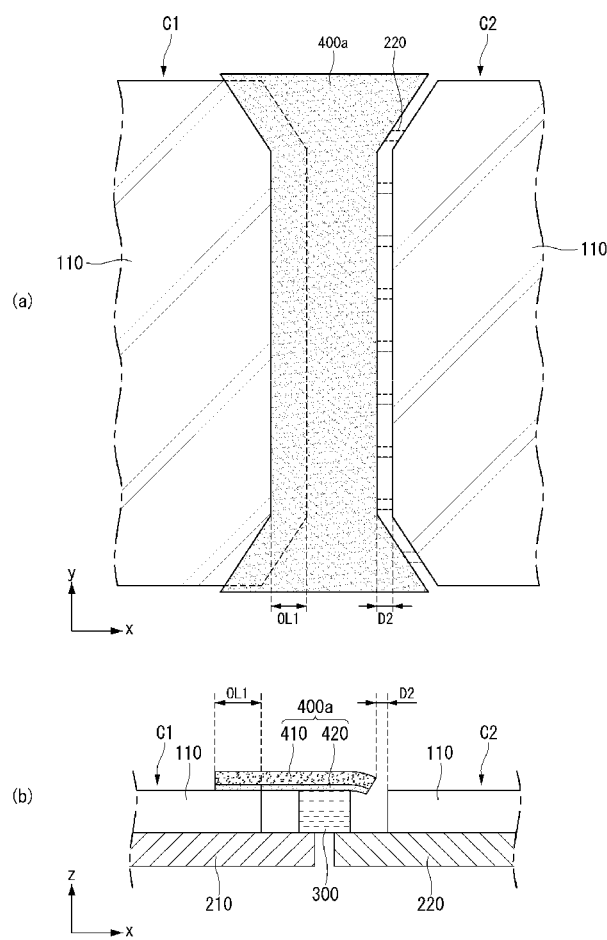
FIG. 20 is a view illustrating a first modified example of a solar cell module according to an embodiment of the invention.

FIG. 20 is a view illustrating a first modified example of a solar cell module according to an embodiment of the present invention.

Specifically, (a) of FIG. 20 is a front view of the solar cell module according to a first modified example, and (b) of FIG. 20 is a cross-sectional view of the solar cell module according to the first modified example illustrated in (a) of FIG. 20 in the first direction (x).

Descriptions of the same components as those of the embodiment of the solar cell module described above will be omitted and different parts will be largely described with reference to FIG. 20.

As illustrated in (a) and (b) of FIG. 20, a single first shield 400a is positioned on a front surface of the interconnector 300 positioned between the first and second solar cells C1 and C2 such that the first shield 400a coheres to overlap (OL1) a front edge area of the semiconductor substrate 110 of the first solar cell C1 and is spaced apart (D2) from the semiconductor substrate 110 of the second solar cell C2.

This may occur due to a processing error during a manufacturing process of the solar cell module, but, even in this instance, since the first shield 400a coheres to the front edge area of the semiconductor substrate 110 of the first solar cell, a possibility of cracks or a possibility of spreading of cracks at the edge area of the semiconductor substrate 110 of the first solar cell may be reduced.

Also, since the first shield 400a completely covers the interconnector 300 positioned between the first and second solar cells C1 and C2, the appearance of the module may be more appealing.

Also, an end of the first shield 400a spaced apart from the semiconductor substrate 110 of the second solar cell C2 as illustrated in FIG. 20 may be bent toward the interconnector 300, a rear surface direction of the module, due to spreading pressure of the upper filler 20 during a lamination process.

So far, the instance in which the single first shield 400a is positioned on the front surface of the interconnector 300 between the first and second solar cells C1 and C2 has been described as an example, but, unlike this, two first shields 400a may be provided as described hereinafter.

Figure 21:
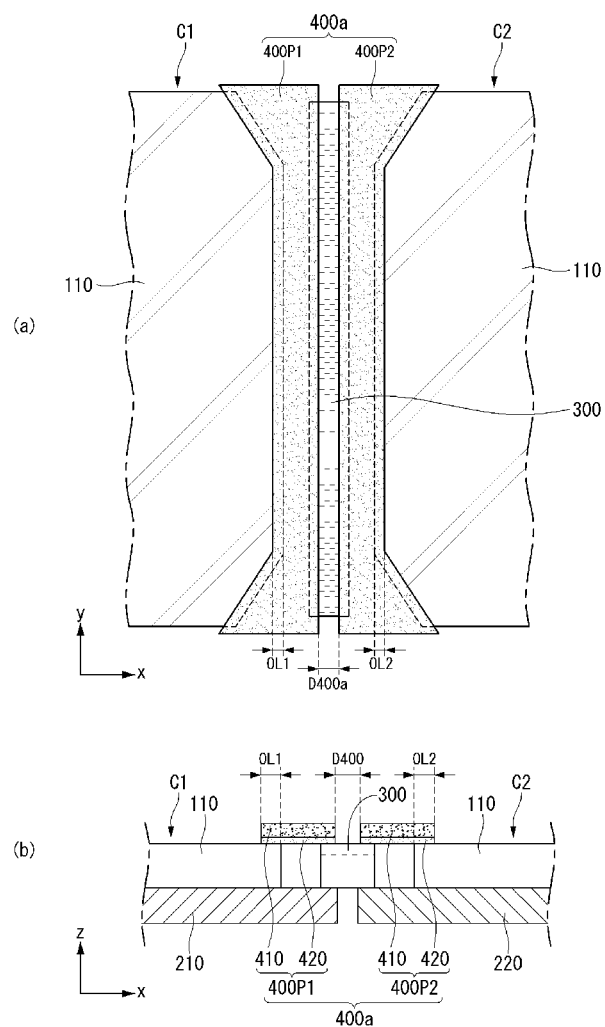
FIG. 21 is a view illustrating a second modified example of a solar cell module according to an embodiment of the invention.

FIG. 21 is a view illustrating a second modified example of a solar cell module according to an embodiment of the present invention.

Here, (a) of FIG. 21 is a front view of the solar cell module according to another modified example, and (b) of FIG. 21 is a cross-sectional view of the solar cell module according to the modified example illustrated in (a) of FIG. 21 in the first direction (x).

Descriptions of the same components as those of the embodiment of the solar cell module described above will be omitted and different parts will be largely described with reference to FIG. 21.

As illustrated in (a) and (b) of FIG. 21, the first shield 400a positioned on the front surface of the interconnector 300 between the first and second solar cells C1 and C2 may include two parts, and first and second shield parts 400P1 and 400P2 forming the first shield 400a may be spaced apart from each other on the front surface of the interconnector 300.

In detail, as illustrated in (a) and (b) of FIG. 21, the first shield 400a may include a first shield part 400P1 and a second shield part 400P2 cohering to the front surface of the interconnector 300 positioned between the first and second solar cells C1 and C2 and spaced apart from each other.

Here, the first shield part 400P1 may cohere to overlap the front edge area of the semiconductor substrate 110 of the first solar cell C1 and the second shield part 400P2 may cohere to overlap the front edge area of the semiconductor substrate 110 of the second solar cell C2.

When the first shield part 400P1 and the second shield part 400P2 of the first shield 400a cohere to the front surface of the interconnector 300 positioned between the first and second solar cells C1 and C2 such that they are spaced apart from each other, an appearance of the module may be less fine, but a possibility of occurrence of cracks or a possibility of spreading of cracks at an edge area of the semiconductor substrate of the solar cell may be reduced.

In FIG. 21, the first shield 400a is divided into a plurality of parts in the first direction (x), but unlike this, a plurality of parts of the first shield 400a may be divided but provided in an overlapping manner, without being spaced apart from each other. This will be described in detail hereinafter.

Figure 22:
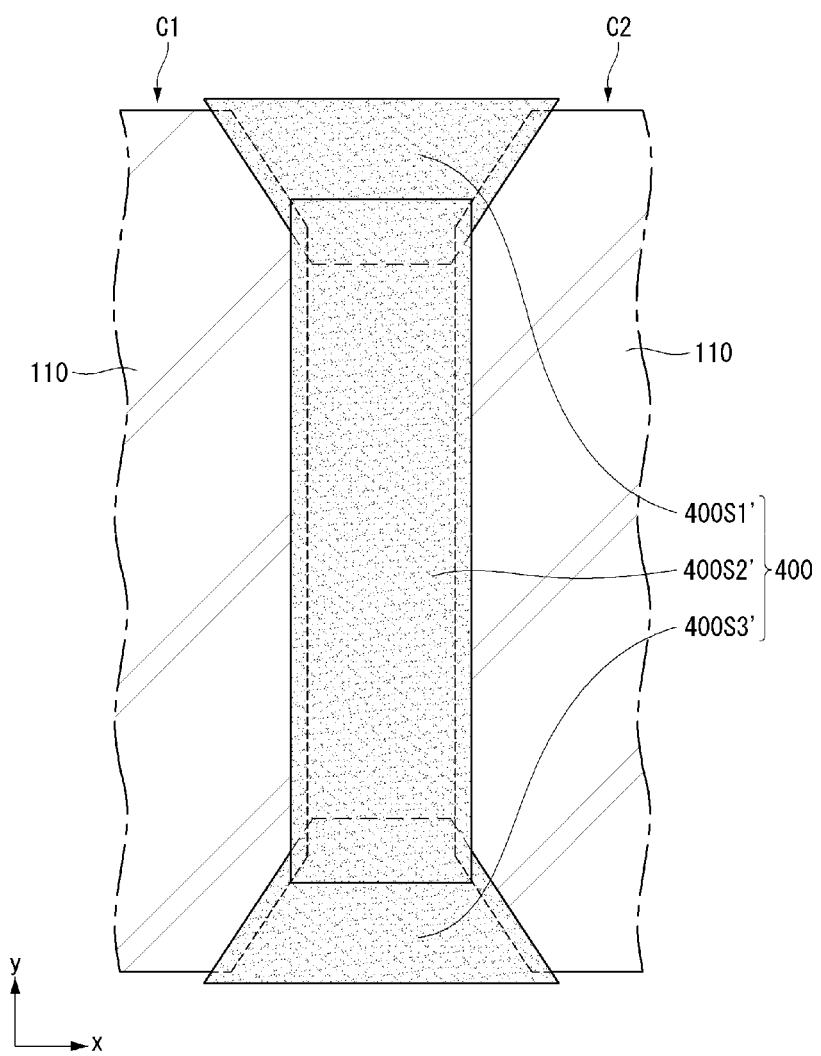
FIG. 22 is a view illustrating a third modified example of a solar cell module according to an embodiment of the invention.

FIG. 22 is a view illustrating a third modified example of a solar cell module according to an embodiment of the present invention.

As illustrated in FIG. 22, a first shield 400a positioned between two adjacent solar cells C1 and C2 may include first, second, and third sub-shields 400S1', 400S2', and 400S3' overlapping each other.

In detail, the first, second, and third sub-shields 400S1', 400S2', and 400S3' may overlap front edge areas of the semiconductor substrates 110 of the solar cells C1 and C2 in the second direction (y).

Here, the first sub-shield 400S1' may have a uniform line width and extend in the second direction (y).

The second and third sub-shields 400S2' and 400S3' may be positioned at one and the other ends of the first sub-shield 400S1' in the second direction (y) and overlap the first sub-shield 400S1'.

Here, a maximum width of the second and third sub-shields 400S2' and 400S3' may be smaller than a space between the two solar cells C1 and C2 and larger than a line width of the first sub-shield 400S1'.

Also, minimum widths of the second and third sub-shields 400S2' and 400S3' may be smaller than a line width of the first sub-shield 400S1', and the widths of the second and third sub-shields 400S2 and 400S3' may be gradually decreased toward the first sub-shield 400S1'.

So far, an example of the first shield 400a has been described, and hereinafter, an example of a second shield 400b will be described.

Figure 23:
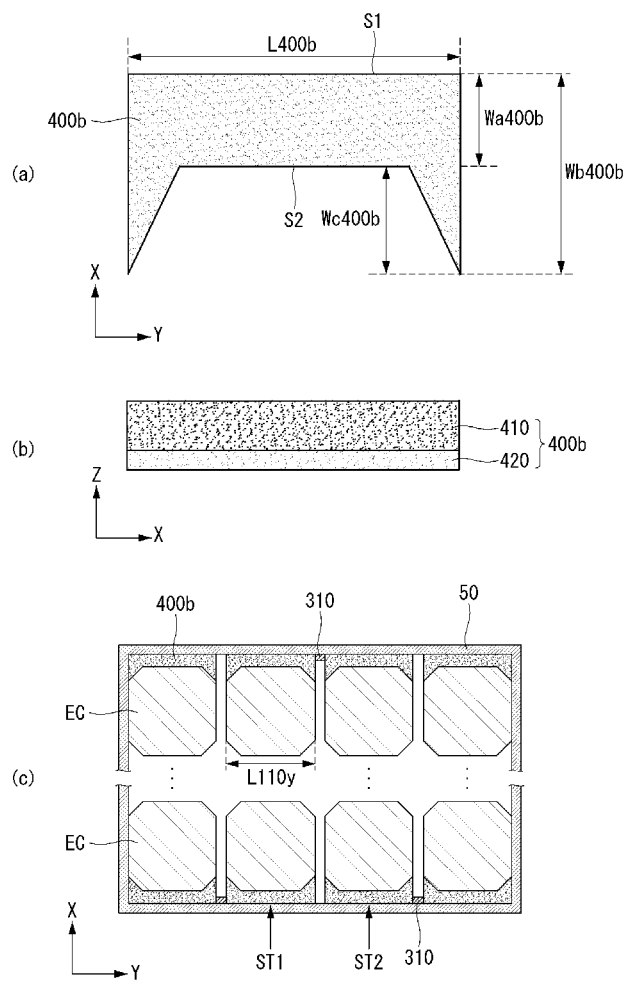
FIGS. 23 and 24 are views illustrating an example of a second shield in a solar cell module according to an embodiment of the invention.
Figure 24:
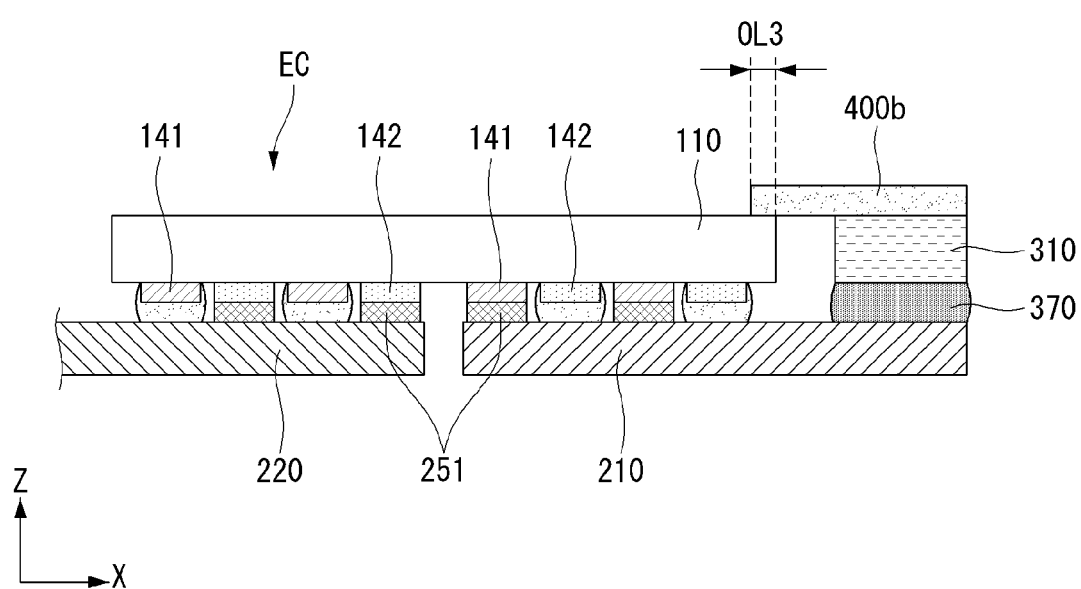

FIGS. 23 and 24 are views illustrating an example of the second shield 400b in a solar cell module according to an embodiment of the present invention. In FIG. 23, (a) is a planar shape of the second shield 400b, (b) is a cross-sectional view of the second shield 400b, and (c) is a view specifically illustrating a position and a function of the second shield 400b. FIG. 24 is a cross-sectional view illustrating a structure in which a bushing bar 310 is connected to a final solar cell EC of each cell string.

As illustrated in FIG. 24, when the solar cell module is viewed from the plane, the bushing bar 310 may be spaced apart from a projection area of the semiconductor substrate 110 provided in a final solar cell EC of each of first and second cell strings ST1 and ST2.

Also, in the solar cell module according to the present invention, an end portion of the first conductive line 210 connected to the final solar cell EC may protrude to the outside of the projection area of the semiconductor substrate 110 of the final solar cell EC and a rear surface of the bushing bar 310 may be connected to a front surface of the protruding end portion of the first conductive line 210.

Also, the bushing bar 310 may be connected to a front surface of the second conductive line 220 connected to the final solar cell EC of an adjacent cell string.

The bushing bar 310 may be connected to the first and second conductive lines 210 and 220 through a third conductive adhesive 370.

The third conductive adhesive 370 may be formed of a material which is the same as or different from that of the first conductive adhesive 251 described above. Thus, a melting point of the third conductive adhesive 370 may be substantially the same as or different from that of the first conductive adhesive 251.

In instances where the third conductive adhesive 370 and the first conductive adhesive 251 are formed of different materials, a melting point of the third conductive adhesive 370 may be higher than that of the first conductive adhesive 251.

As illustrated in (c) of FIG. 23 and FIG. 24, the second shield 400b may extend in the second direction (y) on the front surface of the bushing bar 310 connected to the final solar cell EC of each cell string to visually block the bushing bar 310.

Also, when the solar cell module is viewed from the plane, as illustrated in FIG. 23, an inner part S2 of the second shield 400b may overlap a front edge area of the semiconductor substrate 110 of the final solar cell EC.

Here, referring to FIG. 24, a width OL3 over which the second shield 400b overlaps the front edge area of the semiconductor substrate 110 of the final solar cell EC may be 0.1 mm to 2 mm.

However, unlike the instance illustrated in FIG. 24, the second shield 400b may be spaced apart from the semiconductor substrate 110 of the final solar cell EC. However, although the second shield 400b is spaced apart from the semiconductor substrate 110 of the final solar cell EC, a width by which the second shield 400b is spaced apart from the semiconductor substrate 110 of the final solar cell EC may be smaller than a space between the semiconductor substrate 110 of the final solar cell and the bushing bar 310.

As illustrated in (a) and (c) of FIG. 23, a planar shape of the second shield 400b may be asymmetrical with respect to a central line in the second direction (y) when the solar cell module is viewed from the plane.

In detail, as illustrated in (a) and (c) of FIG. 23, a line width Wb400b of both ends of the second shield 400b in the second direction may be larger than a central line width Wa400b of the second shield 400b, the inner part S2 of the second shield 400b adjacent to the final solar cell EC of each of the first and second cell strings ST1 and ST2 protrudes in the first direction (x) as a direction of the final solar cell EC from a corner portion of the final solar cell EC, and an outer part S1 of the second shield 400b positioned to oppose the inner part S2 may be linearly formed.

Here, the inner part S2 of the second shield 400b may protrude in the first direction (x) from the corner portion of the final solar cell EC.

Accordingly, the inner part S2 of the second shield 400b may correspond to the edge shape of the final solar cell EC. Thus, the protruding portion of the inner part S2 of the second shield 400b may be reduced in width toward an end portion thereof.

Here, a width Wc400b of the protruding portion of the inner part S2 of the second shield 400b in the first direction (x) may be equal to or 1.5 times or less of the central line width Wa400b of the second shield 400b.

Thus, a ratio of the line width Wb400*b* of the end to the central line width Wa400*b* of the second shield 400*b* may be 1:2 to 2.5.

For example, the central line width Wa400*b* of the second shield 400*b* may be 10 mm to 12 mm, and the line width Wb400*b* of the end of the second shield 400*b* may be 23 mm to 26 mm.

Also, a length L400*b* of the second shield in the second direction (y) may be substantially equal to a length L110*y* of the final solar cell EC in the second direction (y).

For example, a length of the second shield 400*b* in the second direction (y) may be 160 mm to 165 mm.

As illustrated in (b) of FIG. 23, the second shield 400*b* may include a substrate 410 formed of an insulating material and a cohesion layer 420 positioned on a rear surface of the substrate 410 and cohering to the bushing bar 310.

Here, the materials of the substrate 410 and the cohesion layer 420 of the second shield 400*b* may respectively be the same as those of the substrate 410 and the cohesion layer 420 of the first shield 400*a* described above.

Also, a color of the second shield 400*b* may be the same as that of the first shield 400*a* described above. Thus, a color of a light receiving surface of the second shield 400*b* may be the same color or the same group color as that of the rear sheet 40 positioned on a rear surface of the solar cell.

When the solar cell module is viewed from the plane, as illustrated in (c) of FIG. 23, the second shields 400*b* may be spaced apart from each other in the second direction (y) between the first and second cell strings ST1 and ST2.

In this instance, as illustrated in (c) of FIG. 23, a portion of the bushing bar 310 may be exposed between the second shields 400*b* spaced apart from each other in the second direction (Y).

Hereinafter, a modified example of the second shield 400*b* in which a portion of the bushing bar 310 is not exposed will be described.

Figure 25:
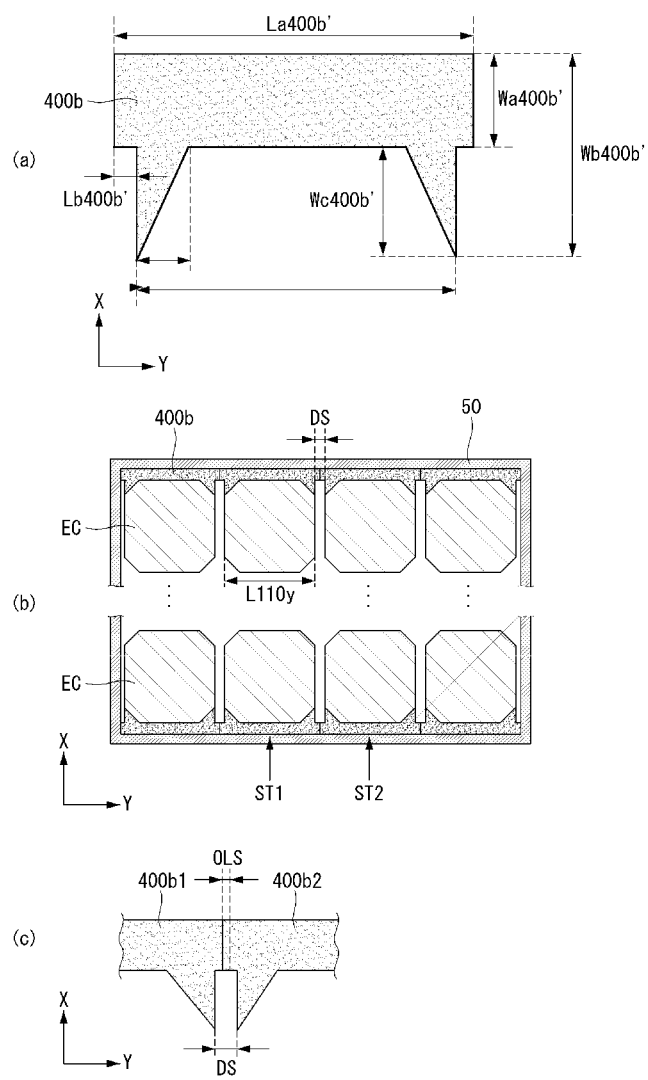
FIG. 25 is a view illustrating a modified example of a second shield in a solar cell module according to an embodiment of the invention.

FIG. 25 is a view illustrating a modified example of the second shield 400*b* in a solar cell module according to an embodiment of the present invention. In FIG. 25, (a) is a planar view of the second shield 400*b* according to the modified example, (b) is a front view of a solar cell module employing the second shield 400*b* according to the modified example, and (c) is a view illustrating an example in which the second shields 400*b* in accordance with the modified example overlap each other in the second direction (y).

As illustrated in (b) of FIG. 25, the second shield 400*b* in accordance with the modified example may be further provided in a space between the first and second cell strings ST1 and ST2 when the solar cell module is viewed from the plane.

Thus, in (c) of FIG. 23, the bushing bar 310 exposed to the space between the first and second cell strings ST1 and ST2 may be completely visually blocked.

Thus, to this end, as illustrated in (a) of FIG. 25, the second shield 400*b* in accordance with the modified example may further extend in the second direction (y) from an end of a portion led in the first direction (x).

Accordingly, a length La400*b*' of the second shield 400*b* in accordance with the modified example in the second direction (y) may be longer than the length L110*y* of the semiconductor substrate 110 provided in the solar cell in the second direction (Y).

A length Lb400*b*' of the portion extending from the second shield 400*b* in accordance with the modified example in the second direction (y) may be smaller than a space DS between two adjacent cell strings and larger than a half of the space DS between the two cell strings.

For example, the length Lb400*b*' of the portion extending from the second shield 400*b* in the second direction (y) may be 2 mm to 3 mm.

Also, a line width Wa400*b*' of the portion extending from the second shield 400*b* in accordance with the modified example in the second direction (y) may be equal to the line width Wa400*b*' of a central portion of the second shield 400*b*, i.e., the minimum line width Wa400*b*' of the second shield 400*b*.

Here, the line width Wa400*b*' of the central portion and the extending portion of the second shield 400*b* in accordance with the modified example may be 10 mm to 12 mm.

Thus, the line width of the second shield 400*b* positioned between the first and second cell strings ST1 and ST2 may be equal to the central line width Wa400*b*' of the second shield 400*b*.

Also, as illustrated in (c) of FIG. 25, a portion extending from a second shield 400*b*1 in accordance with the modified example in the second direction (y) may overlap a portion extending from another second shield 400*b*2 adjacent thereto in the second direction (y).

Here, a width OLS over which the two adjacent second shields 400*b*1 and 400*b*2 overlap each other may be 0.1 mm to 3 mm.

Figure 26:
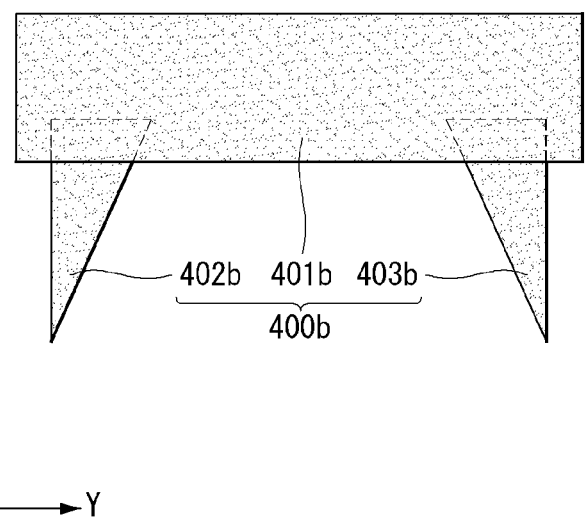
FIG. 26 is a view illustrating an example in which a second shield includes a plurality of second shield parts in an overlapping manner.

FIG. 26 is a view illustrating an example in which the second shield 400*b* includes a plurality of second shield parts in an overlapping manner.

As illustrated in FIG. 26, the second shield 400*b* in accordance with the present invention may be divided into a plurality of parts and the divided parts may overlap each other.

For example, the second shield 400*b* may be divided into first, second, and third sub-shields 401*b*, 402B, and 403*b*, and the first, second, and third sub-shields 401*b*, 402*b*, and 403*b* may overlap each other.

Here, the first sub-shield 401*b* may form a body of the second shield 400*b*, and the second and third sub-shields 402*b* and 403*b* may overlap the first sub-shield 401*b* to form portions protruding from the second shield 400*b* in the first direction (x).

In FIG. 26, the second shield in accordance with the modified example is illustrated as an example, but the second shield illustrated in (a) of FIG. 23 may also be divided into a plurality of sub-shields.

In this manner, since the second shield 400*b* is divided into a plurality of sub-shields, manufacturing cost of the second shield 400*b* may be further reduced.

Figure 27:
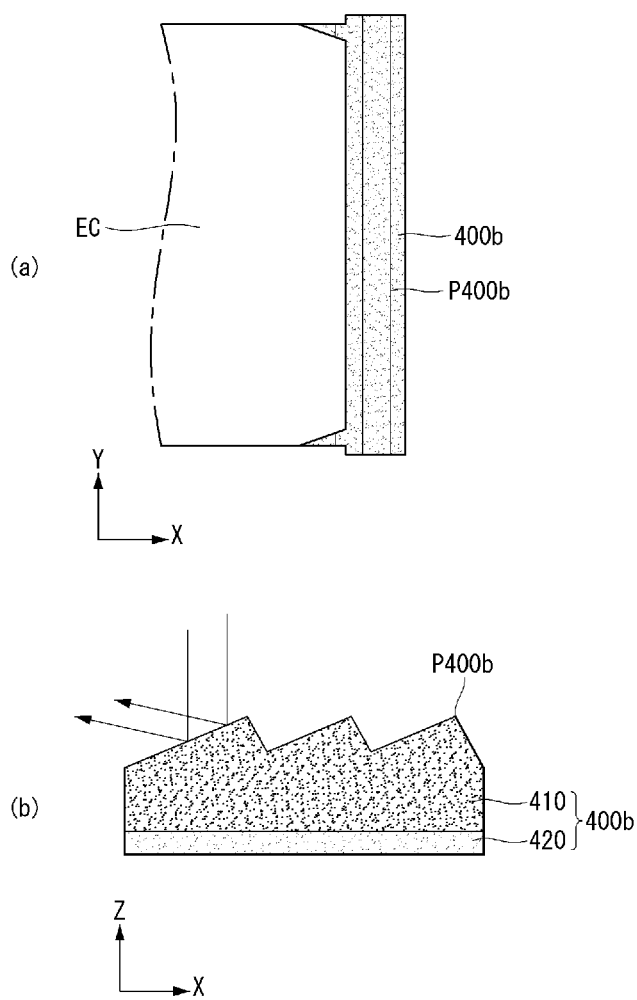
FIG. 27 is a view illustrating an example in which a light reflective structure is provided in a second shield.

FIG. 27 is a view illustrating an example in which a light reflective structure is provided in a second shield 400*b*. In FIG. 27, (a) is a planar view of the second shield 400*b* including a light reflective structure and (b) is a cross-sectional view of the second shield 400*b* including a light reflective structure.

As illustrated in (a) and (b) of FIG. 27, in order to increase light receiving efficiency of the solar cell, the second shield 400*b* may also have a plurality of concavo-convex portions P400*b* on a front surface thereof, a light receiving surface of the substrate, like the first shield 400*a*.

Here, as illustrated in (a) and (b) of FIG. 27, convex portions and concave portions of the concavo-convex portions P400*b* may extend in the second direction (y) and sloped surfaces formed between the convex portions and the concave portions reflect light in the first direction (x), thus increasing light receiving efficiency of the final solar cell 400*b*.

Also, as illustrated in (b) of FIG. 27, in order to allow reflected light reflected by the second shield 400*b* to be more reflected toward the final solar cell EC, a sloped surface orienting toward the final solar cell EC may be larger than a sloped surface orienting in a direction opposite to the final solar cell EC and have a gentler sloped angle.

In this manner, since the solar cell module in accordance with the present invention has the first shield 400a and the second shield 400b described above, the appearance of the solar cell module may be finer and light receiving efficiency of the solar cell module may be further enhanced through the first and second shields 400a and 400b.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A solar cell module comprising:
   a plurality of cell strings including a plurality of solar cells, each solar cell having a semiconductor substrate, and a first conductivity-type electrode and a second conductivity-type electrode provided on a first surface of the semiconductor substrate;
   an interconnector electrically connecting a first conductivity-type electrode of a first solar cell, among the plurality of solar cells included in the plurality of cell strings, and a second conductivity-type electrode of a second solar cell adjacent to the first solar cell in a first direction, to connect the first and second solar cells in series;
   a first conductive line connected to the first conductivity-type electrode and a second conductive line connected to the second conductivity-type electrode; and
   a first shield positioned on a front surface of the interconnector between the first and second solar cells, and extending in a second direction crossing the first direction,
   wherein the first shield comprises:
   first portions positioned between chamfered areas of the semiconductor substrates of the first and second solar cells and forming both ends of the first shield in the second direction, and
   a central portion that is positioned between both ends of the first shield in the second direction;
   a width of the first portions of the first shield is larger than a width of the central portion; and
   an area of the first shield is greater than an area of the interconnector, and the first shield fully covers the interconnector,
   wherein the first and second conductive lines are connected to rear surfaces of the first and second solar cells, and end portions of the first and second conductive lines are alternately connected to the interconnector in the second direction, and
   wherein the first shield overlaps a front edge area of the semiconductor substrate of the first solar cell and a front edge area of the semiconductor substrate of the second solar cell.

2. The solar cell module of claim 1, further comprising a light reflective layer including one of a plurality of concavo-convex portions, light reflective particles, and a metal, the light reflective layer being provided on a front surface of the first shield as a light receiving surface of the first shield.

3. The solar cell module of claim 1, wherein the width of the first portions of the first shield is increased toward both ends of the first shield.

4. The solar cell module of claim 1, wherein the first shield includes a substrate formed of an insulating material and a cohesion layer positioned on a rear surface of the substrate facing the interconnector and cohering to the interconnector.

5. The solar cell module of claim 4, wherein the substrate includes polyethylene terephthalate (PET), and the cohesion layer includes at least one of an epoxy group, an acrylic group, and a silicone group.

6. The solar cell module of claim 1, wherein a color of a light receiving surface of the first shield is the same color or the same group color as a color of a rear sheet positioned on a rear surface of the first and second solar cells.

7. The solar cell module of claim 1, wherein the first shield is positioned to overlap the first and second conductive lines exposed between the first and second solar cells.

8. The solar cell module of claim 1, further comprising:
   a bushing bar connected to a final solar cell of each of adjacent first and second cell strings among the plurality of cell strings and connecting the first and second cell strings in the second direction; and
   a second shield positioned to extend in the second direction on a front surface of the bushing bar, to visually block the bushing bar.

9. The solar cell module of claim 8, wherein a line width of both ends of the second shield in the second direction is larger than a central line width of the second shield, and
   wherein the second shield is asymmetrical with respect to a central line in the second direction.

10. The solar cell module of claim 8, wherein an inner part of the second shield adjacent to the final solar cell of each of the first and second cell strings protrudes toward the final solar cell from a corner portion of the final solar cell, and
    wherein an outer part of the second shield positioned on an opposite side of the inner part is linearly formed.

11. The solar cell module of claim 10, wherein a portion protruding from the inn part of the second shield protrudes in the first direction.

12. The solar cell module of claim 10, wherein the inner part of the second shield is spaced apart from the semiconductor substrate of the final solar cell or overlaps a front edge area of the semiconductor substrate of the final solar cell.

13. The solar cell module of claim 10, wherein the second shield further includes an extending portion positioned between the first and second cell strings.

14. The solar cell module of claim 1, wherein a thickness of the first shield is about 60 nm to 100 nm.

15. The solar cell module of claim 1, wherein a sum of overlapping widths between the first shield and the front edge area of the semiconductor substrate of the first solar cell and the front edge area of the semiconductor substrate of the second solar cell is about 0.2 mm to 3 mm.

* * * * *